(12) United States Patent
Choi et al.

(10) Patent No.: US 11,711,883 B2
(45) Date of Patent: Jul. 25, 2023

(54) DROPLET ACCELERATING ASSEMBLY AND EXTREME ULTRA-VIOLET LITHOGRAPHY APPARATUS INCLUDING THE SAME

(71) Applicant: SAMSUNG ELECTRONICS CO., LTD., Suwon-si (KR)

(72) Inventors: Minseok Choi, Hwaseong-si (KR); Injae Lee, Hwaseong-si (KR); Inho Choi, Seoul (KR); Sungyeol Kim, Yongin-si (KR); Sunghyup Kim, Hwaseong-si (KR); Jeonggil Kim, Hwaseong-si (KR); Jongbin Park, Gangneung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 57 days.

(21) Appl. No.: 17/393,474

(22) Filed: Aug. 4, 2021

(65) Prior Publication Data

US 2022/0174806 A1    Jun. 2, 2022

(30) Foreign Application Priority Data

Dec. 2, 2020   (KR) .......................... 10-2020-0166967

(51) Int. Cl.
*H05G 2/00* (2006.01)
*G03F 7/20* (2006.01)
*G03F 7/00* (2006.01)

(52) U.S. Cl.
CPC ......... *H05G 2/006* (2013.01); *G03F 7/70033* (2013.01); *G03F 7/7055* (2013.01); *H05G 2/008* (2013.01)

(58) Field of Classification Search
CPC .......................... H05G 2/006; G03F 7/70033
See application file for complete search history.

(56) References Cited

U.S. PATENT DOCUMENTS

| 6,738,452 | B2 | 5/2004 | McGregor et al. |
| 7,615,766 | B2 | 11/2009 | Nakano |
| 8,569,721 | B2 | 10/2013 | Nakano et al. |
| 8,598,551 | B2 | 12/2013 | Mestrom et al. |
| 8,993,987 | B2 | 3/2015 | Umeda |
| 9,642,234 | B2 | 5/2017 | Lee et al. |
| 11,437,161 | B1* | 9/2022 | Chang .................... H05G 2/005 |
| 2008/0035865 | A1* | 2/2008 | Komori .................. H05G 2/005 250/504 R |

(Continued)

*Primary Examiner* — Steven Whitesell Gordon
(74) *Attorney, Agent, or Firm* — Lee IP Law, P.C.

(57) ABSTRACT

A droplet accelerating assembly includes an acceleration chamber extending in a first direction parallel to an ejection direction of the droplet, the acceleration chamber having a first side connected to the droplet generator, a second side opposite the first side in the first direction, the second side including a discharge hole, and a fluid flow path, a pressure controller connected to the fluid flow path of the acceleration chamber, the pressure controller being configured to adjust an internal pressure of the acceleration chamber, an electrifier in the acceleration chamber, the electrifier being configured to electrify the droplet ejected by the droplet generator into an electrified droplet, and an accelerator in the acceleration chamber, the accelerator being configured to accelerate the electrified droplet.

19 Claims, 15 Drawing Sheets

(56) References Cited

U.S. PATENT DOCUMENTS

| | | | |
|---|---|---|---|
| 2011/0101863 A1* | 5/2011 | Komori | G03F 7/70916 315/111.41 |
| 2012/0085922 A1 | 4/2012 | Yabu et al. | |
| 2012/0104289 A1* | 5/2012 | Mizoguchi | H05G 2/008 250/504 R |
| 2013/0048878 A1* | 2/2013 | Mizoguchi | H05G 2/005 250/492.1 |
| 2017/0131129 A1 | 5/2017 | Ahr et al. | |

* cited by examiner

DROPLET ACCELERATING ASSEMBLY AND EXTREME ULTRA-VIOLET LITHOGRAPHY APPARATUS INCLUDING THE SAME

CROSS-REFERENCE TO RELATED APPLICATION

Korean Patent Application No. 10-2020-0166967, filed on Dec. 2, 2020, in the Korean Intellectual Property Office, and entitled: "Droplet Accelerating Assembly and Extreme Ultra-Violet Lithography Apparatus Including the Same," is incorporated by reference herein in its entirety.

BACKGROUND

1. Field

Embodiments relate to an extreme ultra-violet (EUV) lithography apparatus, and more particularly, to an EUV lithography apparatus including a droplet accelerating assembly.

2. Description of the Related Art

Recently, as a line width of semiconductor circuits is progressively reduced, lithography source light having a relatively shorter wavelength is needed. For example, EUV light may be used as a source light for lithography. For example, the EUV light may be generated from plasma, which is generated by irradiating carbon dioxide onto a tin droplet.

SUMMARY

According to embodiments, there is provided a droplet accelerating assembly configured to accelerate a droplet ejected by a droplet generator, the droplet accelerating assembly including a droplet accelerating chamber extending in a direction parallel to an ejection direction of the droplet to provide a space, where the droplet moves, and including a flow path for movement of air, one side of the droplet accelerating chamber being connected to the droplet generator and the other side of the droplet accelerating chamber including a discharge hole through which the droplet is discharged, a pressure controlling apparatus connected to the flow path of the droplet accelerating chamber and configured to adjust internal pressure of the droplet accelerating chamber, a droplet electrifying apparatus disposed in the droplet accelerating chamber and configured to electrify the droplet ejected by the droplet generator, and a droplet accelerating apparatus disposed in the droplet accelerating chamber and configured to accelerate the droplet electrified by the droplet electrifying apparatus.

According to embodiments, there is provided a droplet accelerating assembly configured to accelerate a droplet ejected by a droplet generator, the droplet accelerating assembly including a droplet accelerating chamber extending in a direction parallel to an ejection direction of the droplet to provide a space, where the droplet moves, and including a flow path for movement of air, one side of the droplet accelerating chamber being connected to the droplet generator and the other side of the droplet accelerating chamber including a discharge hole through which the droplet is discharged, a pressure controlling apparatus connected to the flow path of the droplet accelerating chamber and configured to adjust internal pressure of the droplet accelerating chamber, a droplet electrifying apparatus disposed in the droplet accelerating chamber and configured to electrify the droplet ejected by the droplet generator, the droplet electrifying apparatus including a droplet electrifying electrode having a ring shape extending along an inner surface of the droplet accelerating chamber to surround the droplet ejected by the droplet generator and an electrification power device configured to apply a voltage to the droplet electrifying electrode, a droplet accelerating apparatus disposed in the droplet accelerating chamber and configured to accelerate the droplet electrified by the droplet electrifying apparatus, the droplet accelerating apparatus including a droplet accelerating electrode having a ring shape, extending along an inner surface of the droplet accelerating chamber to surround a droplet ejected by the droplet generator, and an acceleration power device configured to apply a voltage to the droplet accelerating electrode, and a controller connected to the pressure controlling apparatus, the droplet electrifying apparatus, and the droplet accelerating apparatus and configured to control the internal pressure of the droplet accelerating chamber, a degree of electrification of the droplet electrifying electrode, and a degree of electrification of the droplet accelerating electrode.

According to embodiments, there is provided an extreme ultra-violet (EUV) lithography apparatus including a vessel, a droplet generator disposed in the vessel and configured to generate and eject a droplet, a droplet accelerating assembly connected to the droplet generator in the vessel and configured to accelerate the droplet ejected by the droplet generator, the droplet accelerating assembly including: a droplet accelerating chamber extending in a direction parallel to an ejection direction of the droplet so as to be connected to the droplet generator in the vessel, providing a space through which the droplet moves and is discharged to the vessel, and including a flow path for movement of air; a pressure controlling apparatus connected to the flow path of the droplet accelerating chamber and configured to adjust internal pressure of the droplet accelerating chamber; a droplet electrifying apparatus disposed in the droplet accelerating chamber and configured to electrify the droplet ejected by the droplet generator; and a droplet accelerating apparatus disposed in the droplet accelerating chamber and configured to accelerate the droplet electrified by the droplet electrifying apparatus, a light source configured to irradiate laser light onto the droplet discharged from the droplet accelerating assembly, and a reflection module coupled to the vessel and configured to collect EUV light generated in the vessel.

An EUV lithography apparatus according to an embodiment may include a droplet accelerating assembly which is disposed in a vessel and is connected to a droplet generator, and thus, adjusts internal pressure thereof regardless of internal pressure of the vessel.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
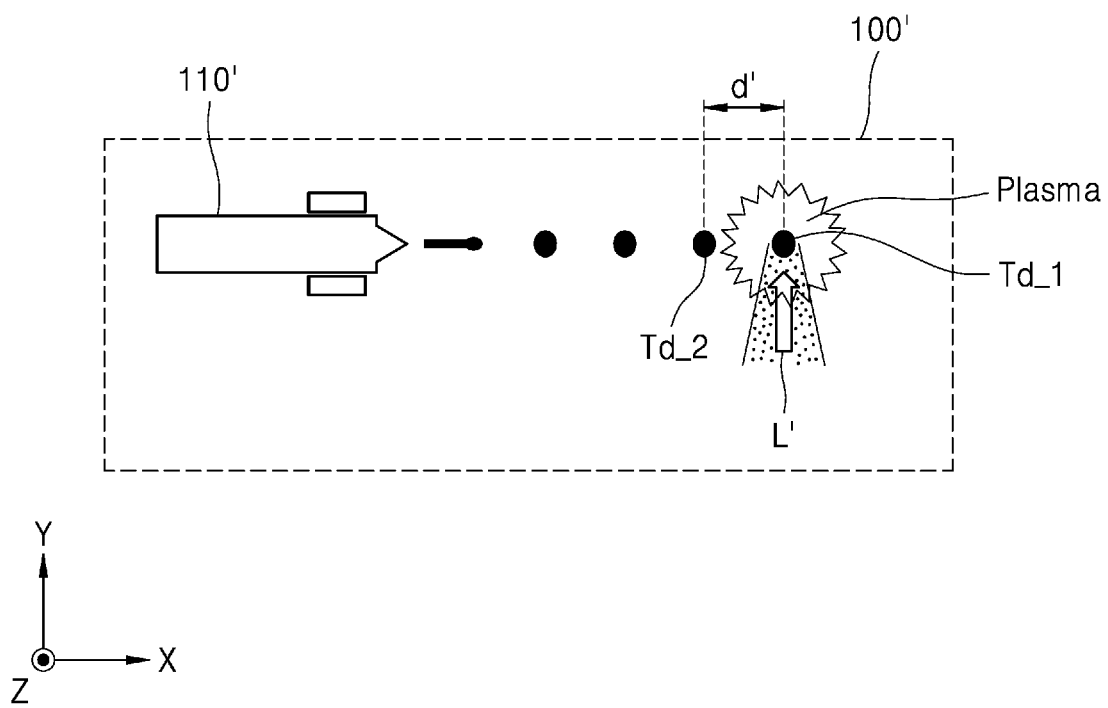
FIG. 1 is a diagram illustrating an operation of generating extreme ultra-violet (EUV) light by using a droplet generator according to a comparative example.

FIG. 1 is a diagram illustrating an operation of generating extreme ultra-violet (EUV) light by using a droplet generator 110' according to a comparative example.

Referring to FIG. 1, the droplet generator 110' according to the comparative example may be configured to generate a tin droplet for generating EUV light and to eject the generated tin droplet. For example, the droplet generator 110' may generate a tin droplet and may eject the tin droplet at a certain period.

Also, laser light L' may be irradiated onto the tin droplet ejected by the droplet generator 110'. For example, the laser light L' irradiated by the droplet generator 110' may include carbon dioxide ($CO_2$) laser light. When the laser light L' is irradiated onto the tin droplet, the tin droplet may be put in a plasma state. Also, EUV light may be generated from the tin droplet having a plasma state.

The droplet generator 110' and EUV light generation from the tin droplet may be in a vessel 100'. Hydrogen gas ($H_2$) may be in the vessel 100'. An internal gas of the vessel 100' is not limited to $H_2$ and may include argon (Ar), nitrogen ($N_2$), etc.

When pressure for enabling $H_2$ to be generated in the vessel 100' is higher than a reference pressure, EUV light, which is generated from tin having a plasma state in the vessel 100', is absorbed by $H_2$. Therefore, the efficiency of generating EUV light may be reduced. Also, when the pressure for enabling $H_2$ to be generated in the vessel 100' is less than the reference pressure, an effect of cleaning an inner portion of the vessel 100' on the basis of $H_2$ may be reduced.

In order to address the problems described above, multiple methods have been attempted. While an ejection frequency of a tin droplet of the droplet generator 110' may be increased to increase the efficiency of generating EUV light, when the ejection frequency of the tin droplet of the droplet generator 110' increases, a separation distance d' between tin droplets may be reduced, thereby causing adverse effects in plasma generated in subsequent tin droplets, e.g., plasma generated from a target tin droplet Td_1 may adversely affect a subsequent tin droplet Td_2. While the intensity of laser light L' irradiated onto the tin droplet may also be increased to increase efficiency of generating EUV light, an increased intensity of the laser light L' may also cause adverse effects in plasma generated in subsequent tin droplets.

Therefore, attempts have been made to increase the separation distance d' between tin droplets, e.g., to increase a speed of a tin droplet ejected by the droplet generator 110'. However, when ejection pressure of the droplet generator 110' increases, the droplet generator 110' may be physically damaged.

Also, in order to increase the separation distance d' between tin droplets, attempts have been made to apply a high voltage to an electrifying apparatus configured to electrify the tin droplet and to an acceleration apparatus configured to accelerate the tin droplet with an electric field. However, since the $H_2$ pressure in the vessel 100' requires restrictive adjustment, i.e., to be maintained at the reference pressure with a predetermined intensity, e.g., a reference pressure of about 1.3 Torr to about 1.6 Torr, application of a high voltage to the electrifying apparatus and the acceleration apparatus may cause an arching phenomenon in the vessel 100' when having the reference pressure.

Therefore, due to the durability of the droplet generator 110' and the limited adjustment of the internal pressure of the vessel 100', it may be difficult to increase the speed of the tin droplet ejected by the droplet generator 110' of FIG. 1.

In view of the above, a droplet accelerating assembly (300 of FIG. 2) and an EUV lithography apparatus (10 of FIG. 2) including the same according to an embodiment may be provided. The droplet accelerating assembly 300 and the EUV lithography apparatus 10 including the same may increase a speed of a droplet and may prevent the physical damage of a droplet generator 200, despite the limited adjustment of internal pressure of a vessel 100 containing the droplet accelerating assembly 300 and the droplet generator 200.

Figure 2:
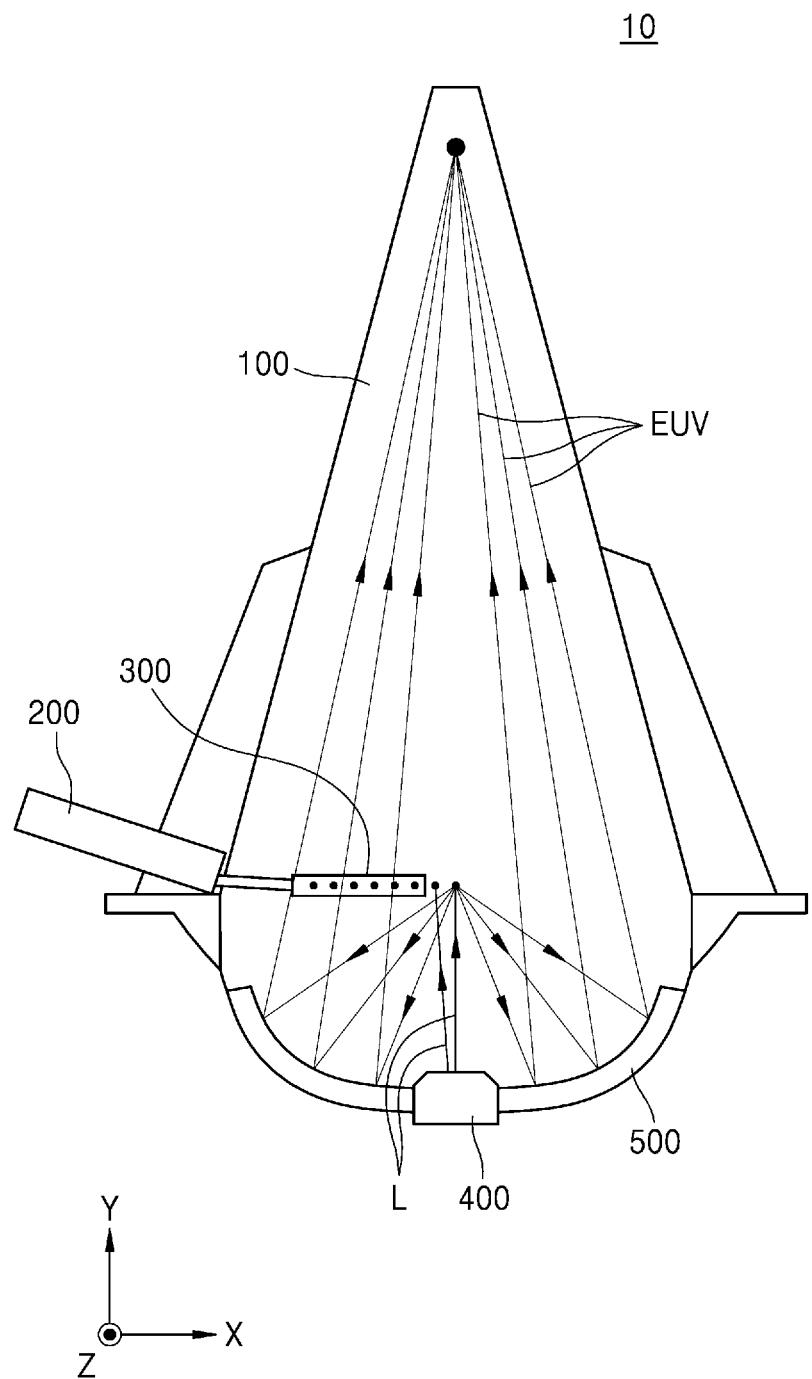
FIG. 2 is a cross-sectional view of an EUV lithography apparatus according to an embodiment.

Hereinafter, the droplet accelerating assembly 300 and the EUV lithography apparatus 10 including the same according to an embodiment will be described in detail with reference to FIG. 2. FIG. 2 is a cross-sectional view of the EUV lithography apparatus 10 according to an embodiment.

The EUV lithography apparatus 10 according to an embodiment may be an apparatus for generating EUV light. In detail, the EUV lithography apparatus 10 may be an apparatus for generating EUV light for enabling a pattern to be formed on a semiconductor substrate.

Referring to FIG. 2, the EUV lithography apparatus 10 according to an embodiment may include the vessel 100, the droplet generator 200, the droplet accelerating assembly 300, a light source 400, and a reflection module 500.

The vessel 100 of the EUV lithography apparatus 10 according to an embodiment may provide an inner space where EUV light is generated. Also, gases having low reactivity may be in the inner space of the vessel 100. For example, at least one gas of $H_2$, Ar, and $N_2$ may be in the inner space of the vessel 100. Also, the inner space of the vessel 100 may be formed in a vacuum state or a low pressure state. For example, the pressure of the inner space of the vessel 100 may be about 1.3 Torr to about 1.6 Torr.

In an embodiment, $H_2$ having low pressure may be in the vessel 100. As an inner portion of the vessel 100 maintains low pressure, a phenomenon may be prevented where EUV light generated in the vessel 100 is absorbed by air. Also, since $H_2$ may be in the vessel 100, an effect of cleaning an inner surface of the vessel 100 on the basis of $H_2$ may increase.

In an embodiment, the vessel 100 may have a tapered shape. For example, the vessel 100 may have a tapered shape where a cross-sectional area thereof in a direction (e.g., an X direction) vertical, e.g., perpendicular, to a movement direction of a laser light L emitted from the light source 400 is reduced toward a direction (e.g., a Y direction) parallel to the movement direction of the laser light L. For example, as illustrated in FIG. 2, a width of the vessel 100 along the X direction may be, e.g., gradually, reduced along the Y direction, e.g., in a direction oriented away from the light source 400. For example, as illustrated in FIG. 2, a width of a lower portion of the vessel 100 along the X direction may be wider than an upper portion of the vessel 100 along the X direction, e.g., the vessel 100 may have a cross-section resembling a triangle with a tapered top.

The droplet generator 200 of the EUV lithography apparatus 10 according to an embodiment may be connected to one side of the vessel 100 and may generate droplets, which are a source material for generating EUV light. The droplet generator 200 may provide the droplets into the inner space of the vessel 100.

In an embodiment, the droplet generator 200 may eject a droplet in the X direction in the vessel 100, as illustrated in FIG. 2. However, a direction in which the droplet generator 200 ejects a droplet is not limited to the above description.

In an embodiment, a material of a droplet generated by the droplet generator 200 may include tin (Sn). Also, the droplet generator 200 may generate a tin droplet and may eject the generated tin droplet into the inner portion of the vessel 100 at a certain period (i.e., a certain frequency).

In an embodiment, the laser light L emitted from the light source 400 may be irradiated onto the tin droplet ejected by the droplet generator 200, and the tin droplet may be put in a plasma state on the basis of the laser light L. Also, as the tin droplet is put in a plasma state, EUV light may be generated in the vessel 100. For example, a wavelength of the EUV light generated in the vessel 100 may be about 4 nm to about 124 nm.

The droplet accelerating assembly 300 of the EUV lithography apparatus 10 according to an embodiment may be an assembly which is disposed in the vessel 100 and is configured to accelerate a droplet ejected from the droplet generator 200. For example, as illustrated in FIG. 2, the droplet accelerating assembly 300 may extend along the X direction from the droplet generator 200 toward a path of the laser light L emitted from the light source 400.

In an embodiment, the droplet accelerating assembly 300 may be disposed in the vessel 100, and an internal pressure of the droplet accelerating assembly 300 may be controlled regardless of the internal pressure of the vessel 100. Therefore, the droplet accelerating assembly 300 may accelerate the droplet ejected from the droplet generator 200 on the basis of an electric field generated in the droplet accelerating assembly 300, despite the limited adjustment of the internal pressure of the vessel 100. That is, the droplet accelerating assembly 300 may increase the speed of a tin droplet ejected by the droplet generator 200 without physically damaging the droplet generator 200 or significantly changing the internal pressure of the vessel 100.

The light source 400 of the EUV lithography apparatus 10 according to an embodiment may provide light to an inner portion of the vessel 100. In an embodiment, the light source 400 may be coupled to one side of the lower portion, e.g., the wider portion, of the EUV lithography apparatus 10. For example, the light source 400 may be coupled to the lower portion of the vessel 100. However, a position of the light source 400 is not limited to the above description.

The laser light L provided to the inner portion of the vessel 100 by the light source 400 may be irradiated onto a droplet ejected from the droplet generator 200. EUV light may be generated from a droplet having a plasma state.

In an embodiment, the laser light L provided to the inner portion of the vessel 100 by the light source 400 may be carbon dioxide laser light L. Also, in a case where the droplet generator 200 ejects a droplet in the X direction, the light source 400 may eject the carbon dioxide laser light L in the Y direction vertical, e.g., perpendicular, to the X direction, which is an ejection direction of the droplet. However, an irradiation direction of the laser light L of the light source 400 is not limited to the above description.

The reflection module 500 of the EUV lithography apparatus 10 according to an embodiment may be a device which is connected to one side of the vessel 100 and is configured to collect EUV light generated in the vessel 100. In an embodiment, the reflection module 500, e.g., a reflector, may be coupled to the lower portion, e.g., wider portion, of the vessel 100. Also, the reflection module 500 may be provided in a concave shape, for collecting EUV light.

The EUV lithography apparatus 10 according to an embodiment may include the droplet accelerating assembly 300 which is disposed in the vessel 100 and is connected to the droplet generator 200 to adjust internal pressure thereof regardless of internal pressure of the vessel 100, and to accelerate a droplet ejected by the droplet generator 200 on the basis of an electric field. Therefore, the EUV lithography apparatus 10 according to an embodiment may include the droplet accelerating assembly 300, and thus, may increase the efficiency of generating EUV light by increasing a speed of a droplet.

Hereinafter, the droplet accelerating assembly 300 according to an embodiment will be described in more detail with reference to FIGS. 3-14.

Figure 3:
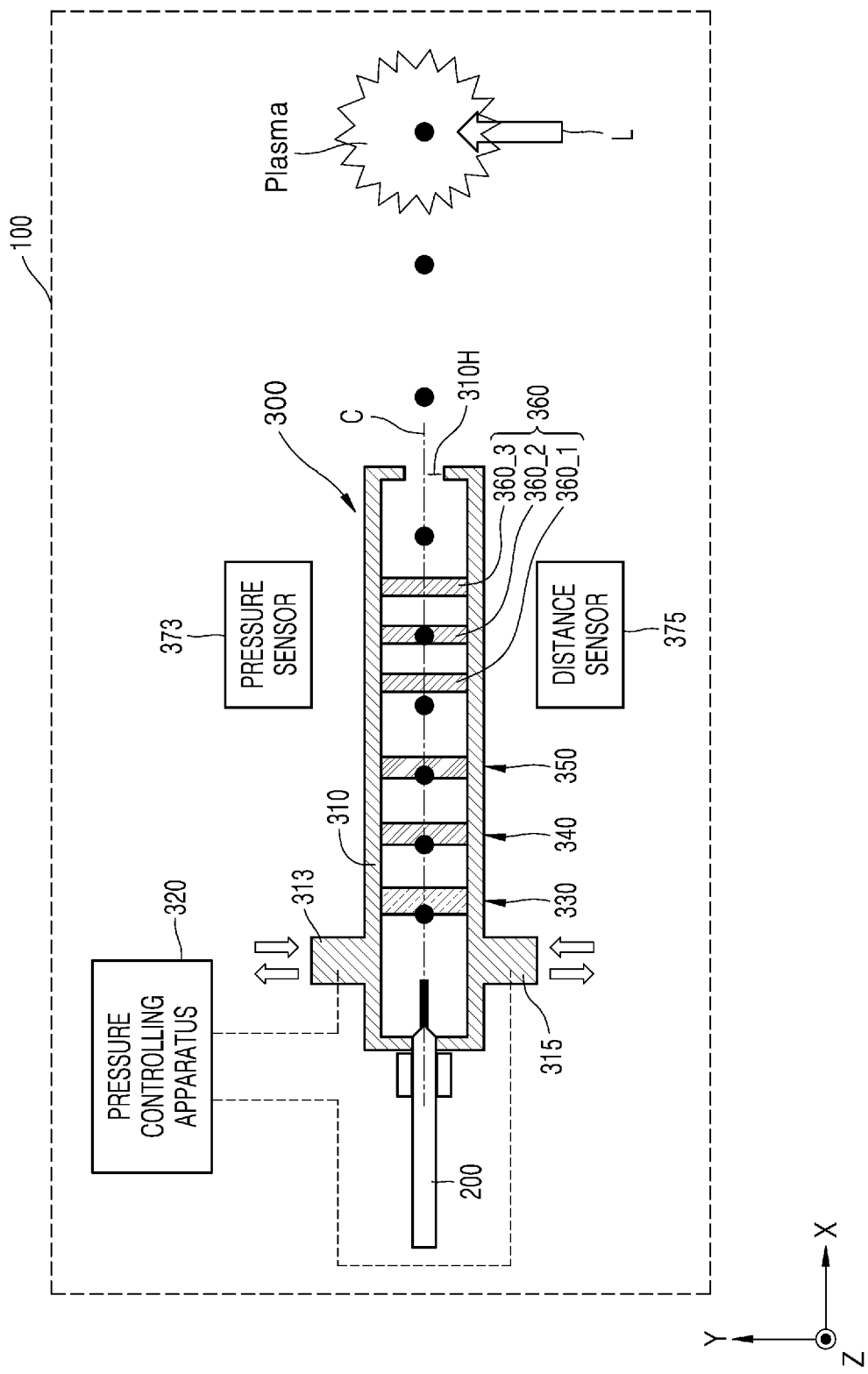
FIG. 3 is a cross-sectional view of a droplet accelerating assembly according to an embodiment.
Figure 4:
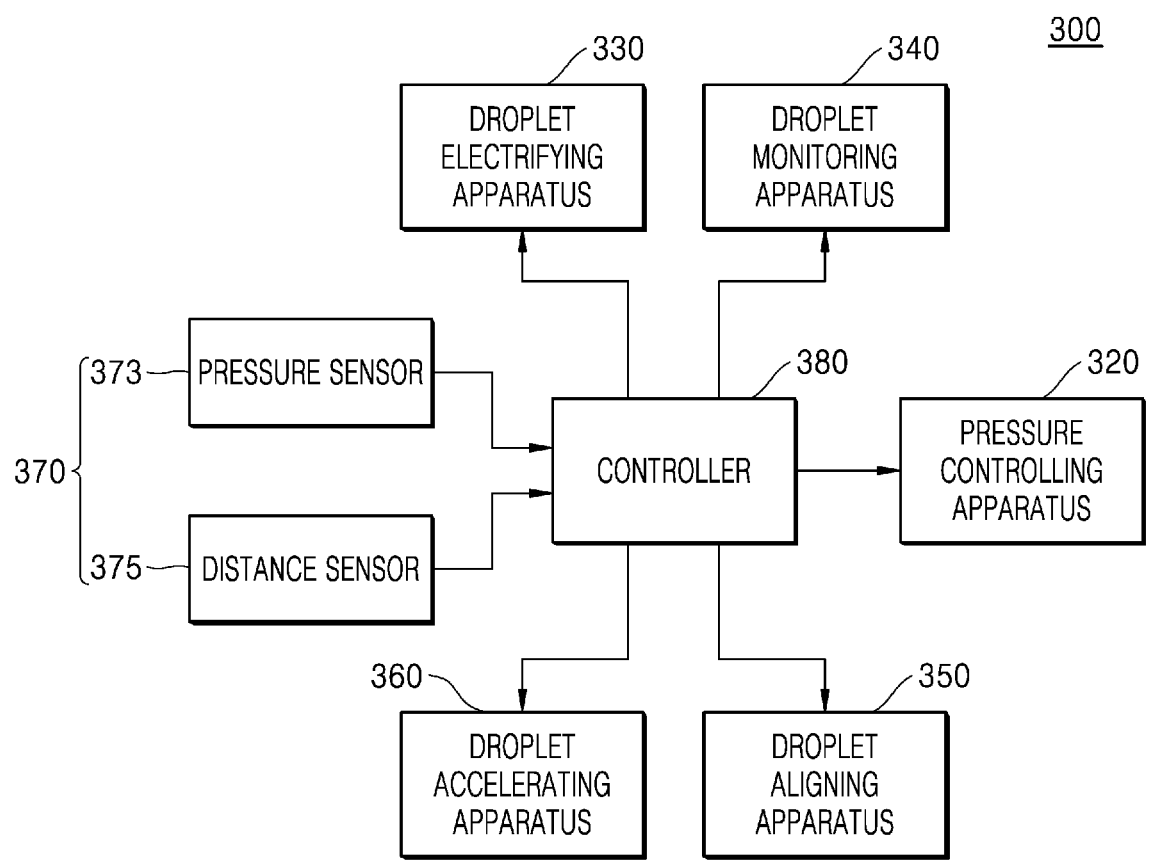
FIG. 4 is a function block diagram of a droplet accelerating assembly according to an embodiment.
Figure 5A:
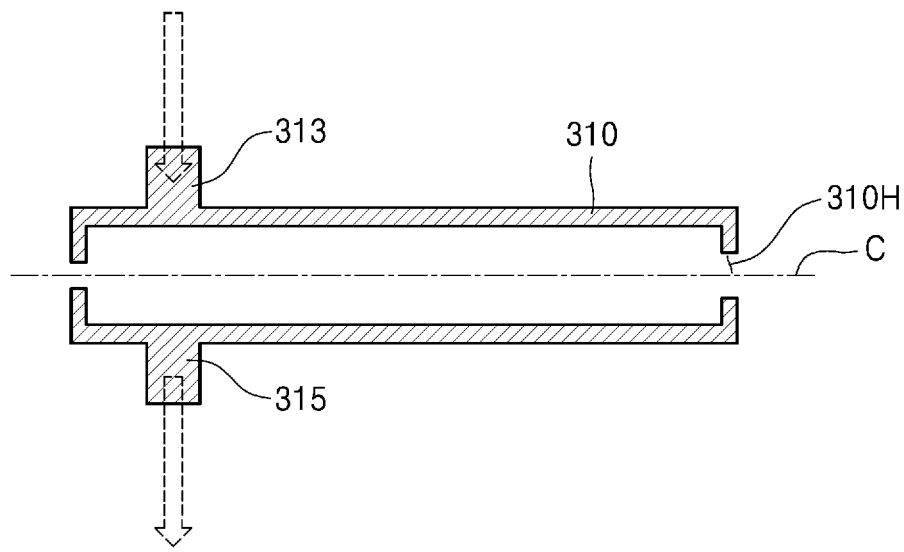
FIGS. 5A and 5B are cross-sectional views of a droplet accelerating chamber of a droplet accelerating assembly according to an embodiment.
Figure 5B:
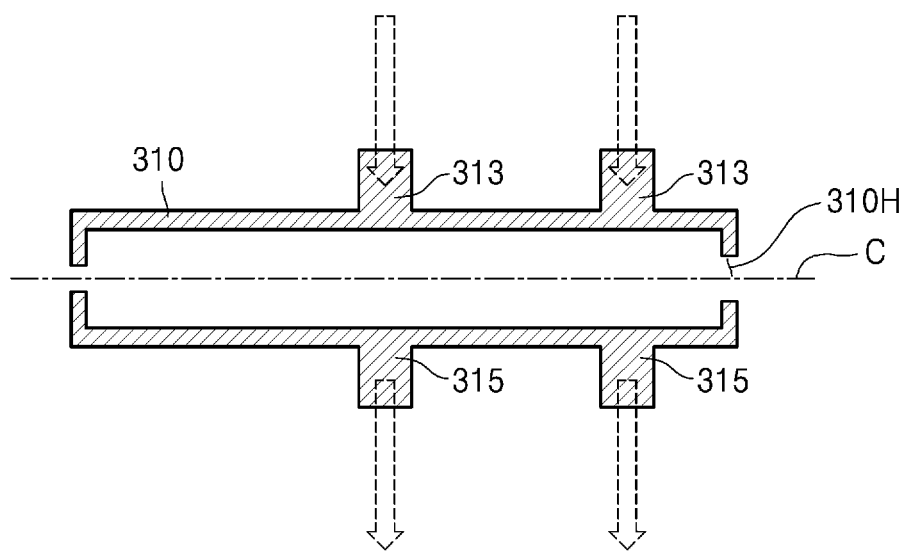
Figure 6:
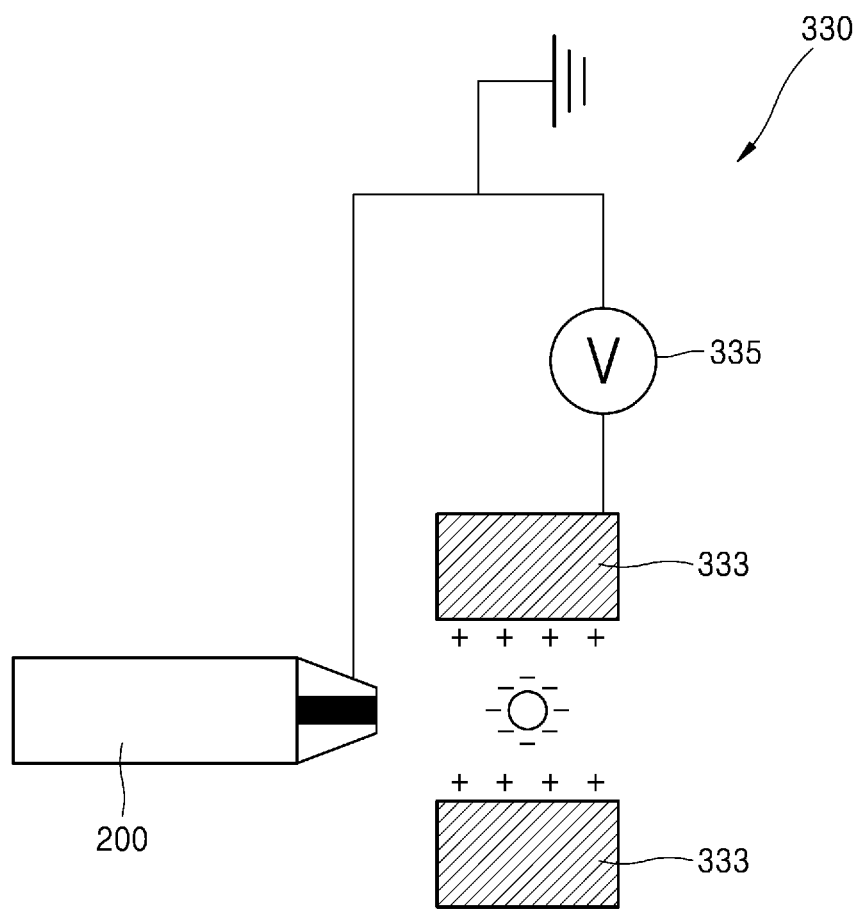
FIG. 6 is a diagram of a droplet electrifying apparatus according to an embodiment.
Figure 7:
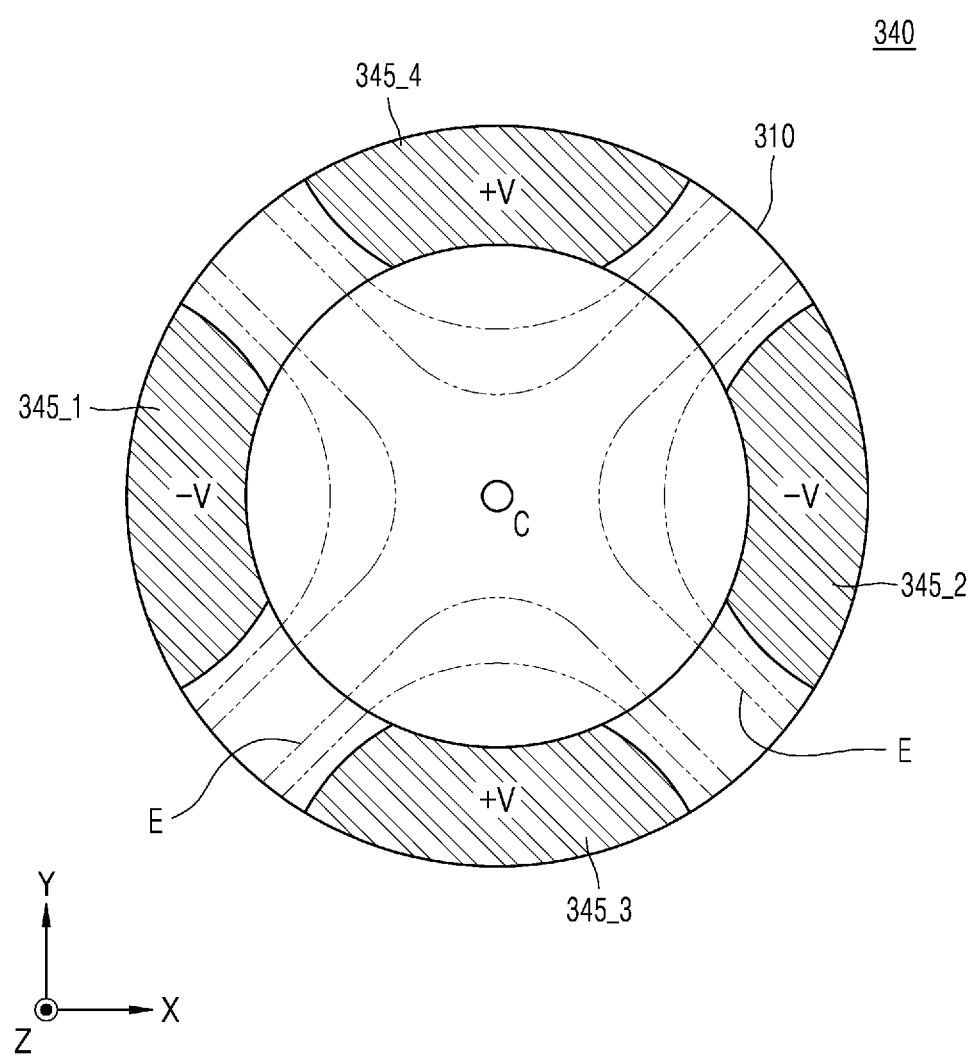
FIG. 7 is a diagram illustrating a droplet monitoring apparatus according to an embodiment.
Figure 8:
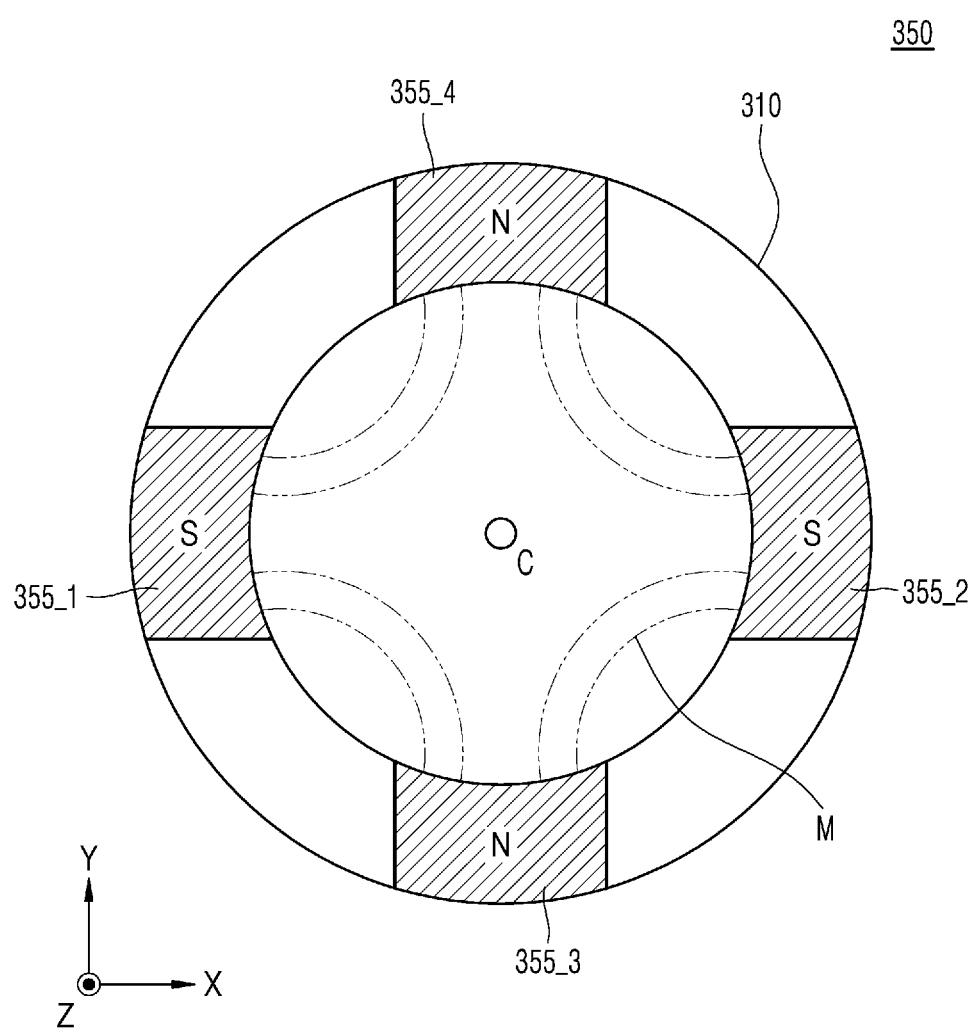
FIG. 8 is a diagram illustrating a droplet aligning apparatus according to an embodiment.
Figure 13:
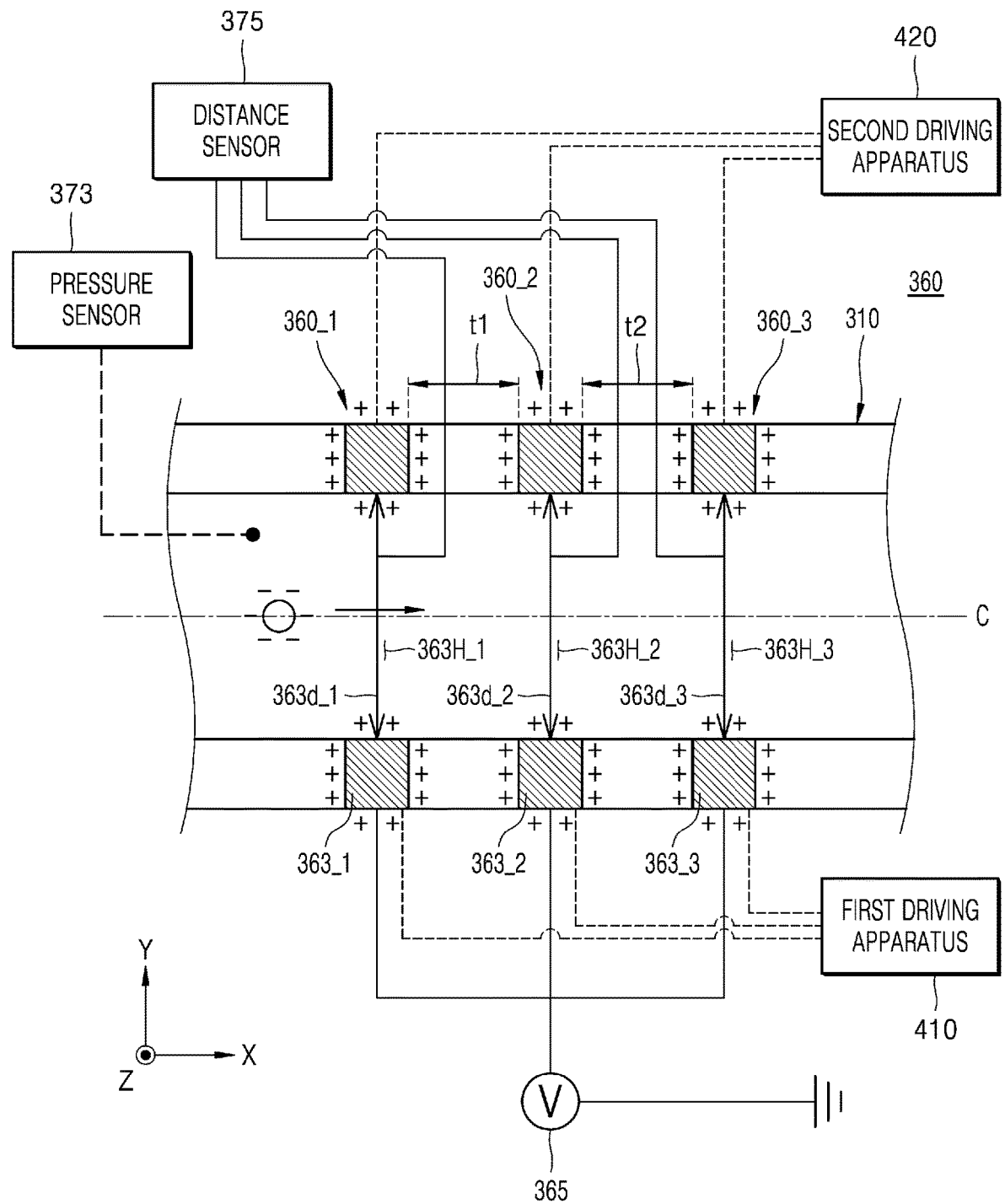
FIGS. 13 and 14 are diagrams illustrating an operation of a droplet accelerating apparatus according to an embodiment.
Figure 14:
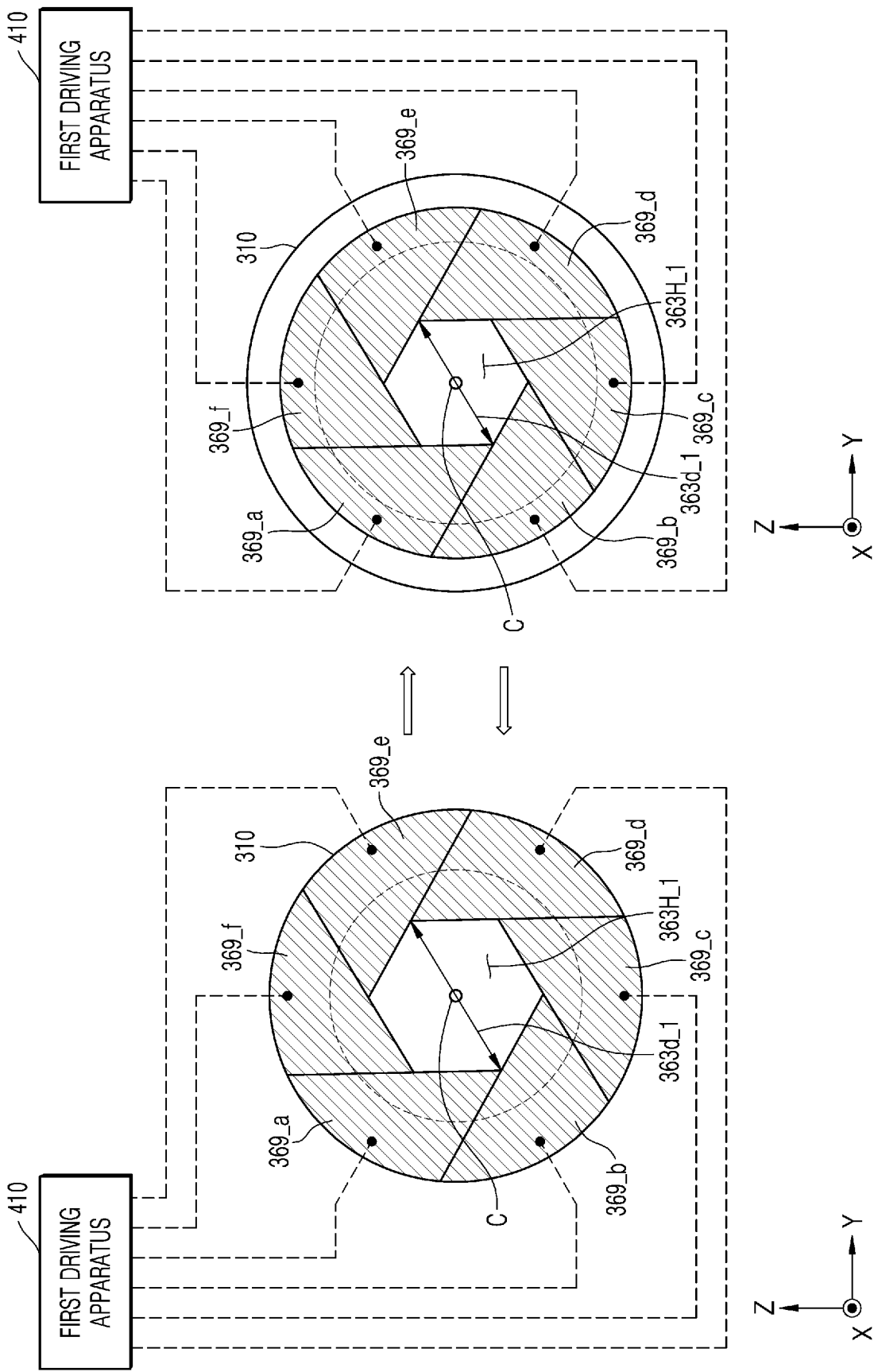

FIG. 3 is a cross-sectional view of the droplet accelerating assembly 300 according to an embodiment. FIG. 4 is a function block diagram of the droplet accelerating assembly 300 according to an embodiment. FIGS. 5A and 5B are cross-sectional views of a droplet accelerating chamber 310 of the droplet accelerating assembly 300 according to an embodiment. FIG. 6 is a diagram illustrating a droplet electrifying apparatus 330 according to an embodiment. FIG. 7 is a diagram illustrating a droplet monitoring apparatus 340 according to an embodiment. FIG. 8 is a diagram illustrating a droplet aligning apparatus 350 according to an embodiment. FIGS. 9 to 12 are diagrams illustrating a droplet accelerating apparatus 360 according to an embodiment. Also, FIGS. 13 and 14 are diagrams illustrating an operation of the droplet accelerating apparatus 360 according to an embodiment.

The droplet accelerating assembly 300 according to an embodiment may be an apparatus which is disposed in an inner space of the vessel 100 in FIG. 2. The droplet accelerating assembly 300 may be coupled to one side of the droplet generator 200 in FIG. 2, and is configured to increase the speed of a droplet ejected from the droplet generator 200.

Referring to FIGS. 3 and 4, the droplet accelerating assembly 300 according to an embodiment may include the droplet accelerating chamber 310 (i.e., an acceleration chamber), a pressure controlling apparatus 320 (i.e., a pressure controller), the droplet electrifying apparatus 330 (i.e., an electrifier), the droplet monitoring apparatus 340 (i.e., a monitor), the droplet aligning apparatus 350 (i.e., an aligner), the droplet accelerating apparatus 360 (i.e., an accelerator), a sensor 370, and a main controller 380.

Referring to FIGS. 3 and 5A, the droplet accelerating chamber 310 of the droplet accelerating assembly 300 may be a chamber which is disposed in a vessel (the vessel 100 of FIG. 2) for generating EUV light. Also, the droplet accelerating chamber 310 may be a chamber including an inner space where a droplet ejected by the droplet generator 200 is accelerated by an electric field.

In an embodiment, a first side of the droplet accelerating chamber 310 may be, e.g., directly, connected to the droplet generator 200. Also, a second side, which is opposite to the first side, of the droplet accelerating chamber 310 may include a discharge hole 310H for discharging the droplet, ejected from the droplet generator 200, to the inner space of the vessel 100.

In an embodiment, the droplet accelerating chamber 310 may have a pipe, e.g., linearly tubular, shape which extends in a direction parallel to a direction in which the droplet generator 200 ejects the droplet. Therefore, the droplet accelerating chamber 310 may surround a path through which the droplet ejected from the droplet generator 200 moves. For example, in a case where the droplet generator 200 ejects the droplet in an X direction, the droplet accelerating chamber 310 may have a pipe shape which extends in the X direction.

For example, the droplet accelerating chamber 310 may include a pipe having a cylindrical shape, which extends in the X direction and is hollow. For example, referring to FIG. 3, the first end of the hollow pipe may be connected to the droplet generator 200, and the second end of the hollow pipe may include the discharge hole 310H for discharging the droplet toward the emitted laser light L.

In an embodiment, the droplet accelerating chamber 310 may include, e.g., formed of, an insulating material. Also, the droplet accelerating chamber 310 may include, e.g., formed of, an opaque material. However, the material of the droplet accelerating chamber 310 may be any suitable material.

In an embodiment, the droplet accelerating chamber 310 may include a plurality of paths 113 and 115 for moving fluid, e.g., air. In other words, the droplet accelerating chamber 310 may include at least one of an inflow path 313, through which air moves from the vessel 100 into an inner portion of the droplet accelerating chamber 310, and a discharge flow path 315, through which air moves out of the droplet accelerating chamber 310 into an inner portion of the vessel 100. For example, the droplet accelerating chamber 310 may include both of the inflow path 313 and the discharge flow path 315. For example, as illustrated in FIG. 3, the inflow path 313 and the discharge flow path 315 may be an inlet pipe and an outlet pipe, respectively, in fluid communication with an interior of the droplet accelerating chamber 310.

In an embodiment, air moving through the inflow path 313 and the discharge flow path 315 of the droplet accelerating chamber 310 may be substantially the same air as an internal air, e.g., atmosphere, of the vessel 100. For example, air moving through the inflow path 313 and the discharge flow path 315 of the droplet accelerating chamber 310 may include at least one of $H_2$, $N_2$, and Ar.

In an embodiment, the inflow path 313 and the discharge flow path 315 may extend in a direction vertical, e.g., perpendicular, to a direction in which the droplet accelerating chamber 310 extends, and may be connected to a portion of the droplet accelerating chamber 310. For example, in a case where the droplet accelerating chamber 310 extends in the X direction, the inflow path 313 and the discharge flow path 315 may extend in the Y direction vertical the X direction, and may be connected to a portion of the droplet accelerating chamber 310.

In an embodiment, the droplet accelerating chamber 310 including the inflow path 313 and the discharge flow path 315 may have a symmetrical shape, e.g., the inflow path 313 and the discharge flow path 315 may face each other from opposite sides of the droplet accelerating chamber 310. For example, a shape of the droplet accelerating chamber 310 including the inflow path 313 and the discharge flow path 315 may have a center axis C through its center along the X direction, and the inflow path 313 and the discharge flow path 315 may be symmetrical with respect to the center axis C, which extends in a direction parallel to the ejection direction of a droplet.

The inflow path 313 and the discharge flow path 315 of the droplet accelerating chamber 310 may be symmetrical with respect to the center axis C crossing the center of the droplet accelerating chamber 310, and thus, movement of internal air in the droplet accelerating chamber 310 may be symmetrical with respect to the central axis C. Therefore, deviation from a vibration and the center axis C of a droplet ejected by the droplet generator 200 may be reduced.

In an embodiment, at least one of the inflow path 313 and the discharge flow path 315 of the droplet accelerating chamber 310 may be connected to the pressure controlling apparatus 320 which will be described below. Also, an internal pressure of the droplet accelerating chamber 310 may be adjusted through the pressure controlling apparatus 320. In other words, the internal pressure of the droplet accelerating chamber 310 may be adjusted regardless, e.g., independently, of the internal pressure of the vessel 100.

The internal pressure of the droplet accelerating chamber 310 may be adjusted regardless, e.g., independently, of the internal pressure of the vessel 100, and thus, a high voltage may be applied to the droplet electrifying apparatus 330 and the droplet accelerating apparatus 360 in the droplet accelerating chamber 310. As a high voltage is applied to the droplet electrifying apparatus 330 and the droplet accelerating apparatus 360, a movement speed of a droplet in the droplet accelerating chamber 310 may increase.

The pressure controlling apparatus 320 of the droplet accelerating assembly 300 according to an embodiment may be connected to the droplet accelerating chamber 310 and may be configured to adjust the internal pressure of the droplet accelerating chamber 310. For example, the pressure controlling apparatus 320 may be connected to at least one of the inflow path 313 and the discharge flow path 315 of the droplet accelerating chamber 310, and may be configured to control the movement of air into the inner portion of the droplet accelerating chamber 310, e.g., the pressure controlling apparatus 320 may control the movement of air into the inner portion of the droplet accelerating chamber 310 through the inflow path 313 to increase pressure in the droplet accelerating chamber 310. For example, the pressure controlling apparatus 320 may include a pressure pump connected to the droplet accelerating chamber 310, e.g., to the inflow path 313 and/or the discharge flow path 315, and a valve configured to control the flow of air into and/or out of the droplet accelerating chamber 310.

For example, as illustrated in FIG. 5A, the droplet accelerating chamber 310 may include a single one of each of the inflow path 313 and the discharge flow path 315. In another example, as illustrated in FIG. 5B, each of the inflow path 313 and the discharge flow path 315 of the droplet accelerating chamber 310 of the droplet accelerating assembly 300 according to an embodiment may be provided in plurality. For example, as illustrated in FIG. 5B, two of each of the inflow path 313 and the discharge flow path 315 may be provided, such that two of the inflow paths 313 may be arranged at one side of the droplet accelerating chamber 310, and the two of the discharge flow paths 315 may be arranged at another side of the droplet accelerating chamber 310 opposite to the two of the inflow paths 313. For example, the two inflow paths 313 and the two discharge flow paths 315 may be arranged symmetrically with respect to the center axis C.

For example, as illustrated in FIG. 5A, the inflow path 313 and the discharge flow path 315 may be connected to a portion of the droplet accelerating chamber 310 adjacent to the first end thereof, e.g., adjacent to the droplet generator 200. In another example, as illustrated in FIG. 5B, the inflow paths 313 may be spaced apart from each other, and the discharge flow paths 315 may be paced apart from each other, such that at least one of each of the inflow paths 313 and the discharge flow paths 315 may be connected to a portion of the droplet accelerating chamber 310 adjacent to the second end thereof, e.g., adjacent to the discharge hole 310H. A shape of the droplet accelerating chamber 310 including a plurality of the inflow paths 313 and the discharge flow paths 315, e.g., as illustrated in FIG. 5B, may cross a center of the droplet accelerating chamber 310 and may be symmetrical with respect to the center axis C, which extends in a direction parallel to the ejection direction of a droplet.

Referring to FIGS. 3 and 6, the droplet electrifying apparatus 330 of the droplet accelerating assembly 300 according to an embodiment may be configured to electrify a droplet ejected from the droplet generator 200. In detail, the droplet electrifying apparatus 330 may electrify a surface of the droplet, ejected from the droplet generator 200, to a positive polarity or a negative polarity.

In an embodiment, the droplet electrifying apparatus 330 may include a droplet electrifying electrode 333 and an electrification power device 335 configured to apply a voltage to the droplet electrifying electrode 333. In an embodiment, the droplet electrifying electrode 333 may be an electrode having a ring shape, which extends along an inner surface of the droplet accelerating chamber 310 to surround a droplet ejected from the droplet generator 200. In other words, the droplet electrifying electrode 333 may be a ring-shaped electrode including a hole, e.g., directly, on the inner surface of the droplet accelerating chamber 310, so a droplet ejected from the droplet generator 200 may pass through a center portion of the hole of the ring-shaped electrode 333.

In an embodiment, the droplet electrifying electrode 333 may include a conductive material. Therefore, a surface of the droplet electrifying electrode 333 may be electrified to a positive or negative polarity on the basis of a voltage provided by the electrification power device 335.

In an embodiment, the electrification power device 335 may be a device configured to apply voltage to the droplet electrifying electrode 333. Also, the electrification power device 335 may be outside the droplet accelerating chamber 310 and may be electrically connected to the droplet electrifying electrode 333 through a wiring including a conductive material. For example, the electrification power device 335 may include at least one of a power supply and a high voltage power amplifier.

In an embodiment, the droplet electrifying electrode 333 and the electrification power device 335 applying voltage to the droplet electrifying electrode 333 may each be provided in plurality, e.g., a plurality of droplet electrifying electrodes 333 may be spaced apart from each other inside the interior of the droplet accelerating chamber 310 along the ejection direction of a droplet. For example, the plurality of electrification power devices 335 may respectively apply voltages having different levels to the plurality of droplet electrifying electrodes 333. Therefore, the electrification intensities of the plurality of droplet electrifying electrodes 333 may differ.

In an embodiment, when a surface of the droplet electrifying electrode 333 is electrified to a positive polarity by the electrification power device 335, a surface of a droplet, which is ejected by the droplet generator 200 and passes through the droplet electrifying electrode 333, may be electrified to a negative polarity. However, embodiments are not limited thereto, and when the surface of the droplet electrifying electrode 333 is electrified to a negative polarity by the electrification power device 335, the surface of the droplet, which is ejected by the droplet generator 200 and passes through the droplet electrifying electrode 333, may be electrified to a positive polarity.

Referring to FIGS. 3 and 7, the droplet monitoring apparatus 340 of the droplet accelerating assembly 300 according to an embodiment may be an apparatus which is disposed in the droplet accelerating chamber 310 and is configured to observe the movement of a droplet. In an embodiment, the droplet monitoring apparatus 340 may have a ring shape which extends along an inner surface of the droplet accelerating chamber 310 to surround a droplet ejected from the droplet generator 200. Also, the droplet monitoring apparatus 340 may be spaced apart from the droplet electrifying apparatus 330 in the X direction. For example, the droplet monitoring apparatus 340 may be disposed between the droplet electrifying apparatus 330 and the droplet aligning apparatus 350. However, a position of the droplet monitoring apparatus 340 is not limited thereto.

For example, as illustrated in FIG. 7, the droplet monitoring apparatus 340 may include a plurality of droplet monitoring electrodes 345_1 to 345_4 disposed on an inner surface of the droplet accelerating chamber 310. In FIG. 7, the droplet monitoring apparatus 340 is illustrated as including four droplet monitoring electrodes 345_1 to 345_4 (e.g., first to fourth droplet monitoring electrodes 345_1 to 345_4). However, the number of droplet monitoring electrodes 345_1 to 345_4 included in the droplet monitoring apparatus 340 is not limited thereto.

For example, the first to fourth droplet monitoring electrodes 345_1 to 345_4 may be spaced apart from one another in the droplet accelerating chamber 310. For example, the first to fourth droplet monitoring electrodes 345_1 to 345_4 may be spaced apart from one another between an inner surface and an outer surface of the droplet accelerating chamber 310, e.g., the first to fourth droplet monitoring electrodes 345_1 to 345_4 may be spaced apart from one another along a circumference of the droplet accelerating chamber 310 within sidewalls of the droplet accelerating chamber 310.

In an embodiment, the first to fourth droplet monitoring electrodes 345_1 to 345_4 may be disposed in the droplet accelerating chamber 310 so as to be symmetrical with respect to the center axis C of the droplet accelerating chamber 310. For example, the first droplet monitoring electrode 345_1 and the second droplet monitoring electrode 345_2 may face each other, and the third droplet monitoring electrode 345_3 and the fourth droplet monitoring electrode 345_4 may face each other.

In an embodiment, a negative voltage −V may be applied to the first droplet monitoring electrode 345_1 and the second droplet monitoring electrode 345_2, and a positive voltage +V may be applied to the third droplet monitoring electrode 345_3 and the fourth droplet monitoring electrode 345_4. When voltage is applied to the first to fourth droplet monitoring electrodes 345_1 to 345_4, an electric field E may be generated in the droplet accelerating chamber 310 near the first to fourth droplet monitoring electrodes 345_1 to 345_4.

In an embodiment, the droplet monitoring apparatus 340 may measure a position of a droplet passing through the droplet electrifying apparatus 330 by using the electric field E generated by the first to fourth droplet monitoring electrodes 345_1 to 345_4. For example, while an electrified droplet (after passing through the droplet electrifying apparatus 330) is passing through the first to fourth droplet monitoring electrodes 345_1 to 345_4, the droplet monitoring apparatus 340 may sense a variation of an internal electric field E of the droplet accelerating chamber 310 to measure a position of the electrified droplet. Also, the droplet monitoring apparatus 340 may measure a distance by which a droplet is spaced apart from the center axis C of the droplet accelerating chamber 310, thereby measuring the position of the electrified droplet. Also, the droplet monitoring apparatus 340 may transfer the measured position of the droplet to the main controller 380 described below.

Referring to FIGS. 3 and 8, the droplet aligning apparatus 350 of the droplet accelerating assembly 300 according to an embodiment may be an apparatus which is disposed in the droplet accelerating chamber 310 and is configured to align a position of a droplet in the droplet accelerating chamber 310.

In an embodiment, the droplet aligning apparatus 350 may have a ring shape which extends along an inner surface of the droplet accelerating chamber 310 to surround a droplet ejected from the droplet generator 200. Also, the droplet aligning apparatus 350 may be spaced apart from the droplet monitoring apparatus 340 in the X direction. For example, the droplet aligning apparatus 350 may be between the droplet monitoring apparatus 340 and the droplet accelerating apparatus 360. However, a position of the droplet aligning apparatus 350 is not limited thereto.

In an embodiment, the droplet aligning apparatus 350 may include a plurality of electromagnets 355_1 to 355_4 having magnetism on the basis of an electrical signal. For example, as illustrated in FIG. 8, the droplet aligning apparatus 350 may include four electromagnets (e.g., first to fourth electromagnets 355_1 to 355_4). However, the number of electromagnets 355_1 to 355_4 included in the droplet aligning apparatus 350 is not limited thereto.

In an embodiment, the first to fourth electromagnets 355_1 to 355_4 may be disposed in the droplet accelerating chamber 310 so as to be symmetrical with respect to the center axis C of the droplet accelerating chamber 310. For example, the first electromagnet 355_1 and the second electromagnet 355_2 may face each other, and the third electromagnet 355_3 and the fourth electromagnet 355_4 may face each other.

In an embodiment, as illustrated in FIG. 8, each of the first electromagnet 355_1 and the second electromagnet 355_2 may have an S pole magnetism, and each of the third electromagnet 355_3 and the fourth electromagnet 355_4 may have an N pole magnetism. The kind of magnetism of each of the first to fourth electromagnets 355_1 to 355_4 is not limited thereto. As the first to fourth electromagnets 355_1 to 355_4 have a magnetism, a magnetic field M may be generated in the droplet accelerating chamber 310 adjacent to the droplet aligning apparatus 350.

In an embodiment, the droplet aligning apparatus 350 may correct a position of an electrified droplet with an electromagnetic force by using the magnetic field M generated by the first to fourth electromagnets 355_1 to 355_4. In detail, while an electrified droplet is passing through the first to fourth electromagnets 355_1 to 355_4, the droplet aligning apparatus 350 may correct a position of the electrified droplet by using an electromagnetic force.

For example, based on a position error of an electrified droplet measured by the droplet monitoring apparatus 340, the droplet aligning apparatus 350 may asymmetrically apply a current to each of the first to fourth electromagnets 355_1 to 355_4 to correct a position of the electrified droplet. An operation of correcting a position of an electrified droplet may denote an operation of placing the electrified droplet at the center axis C of the droplet accelerating chamber 310.

Figure 9:
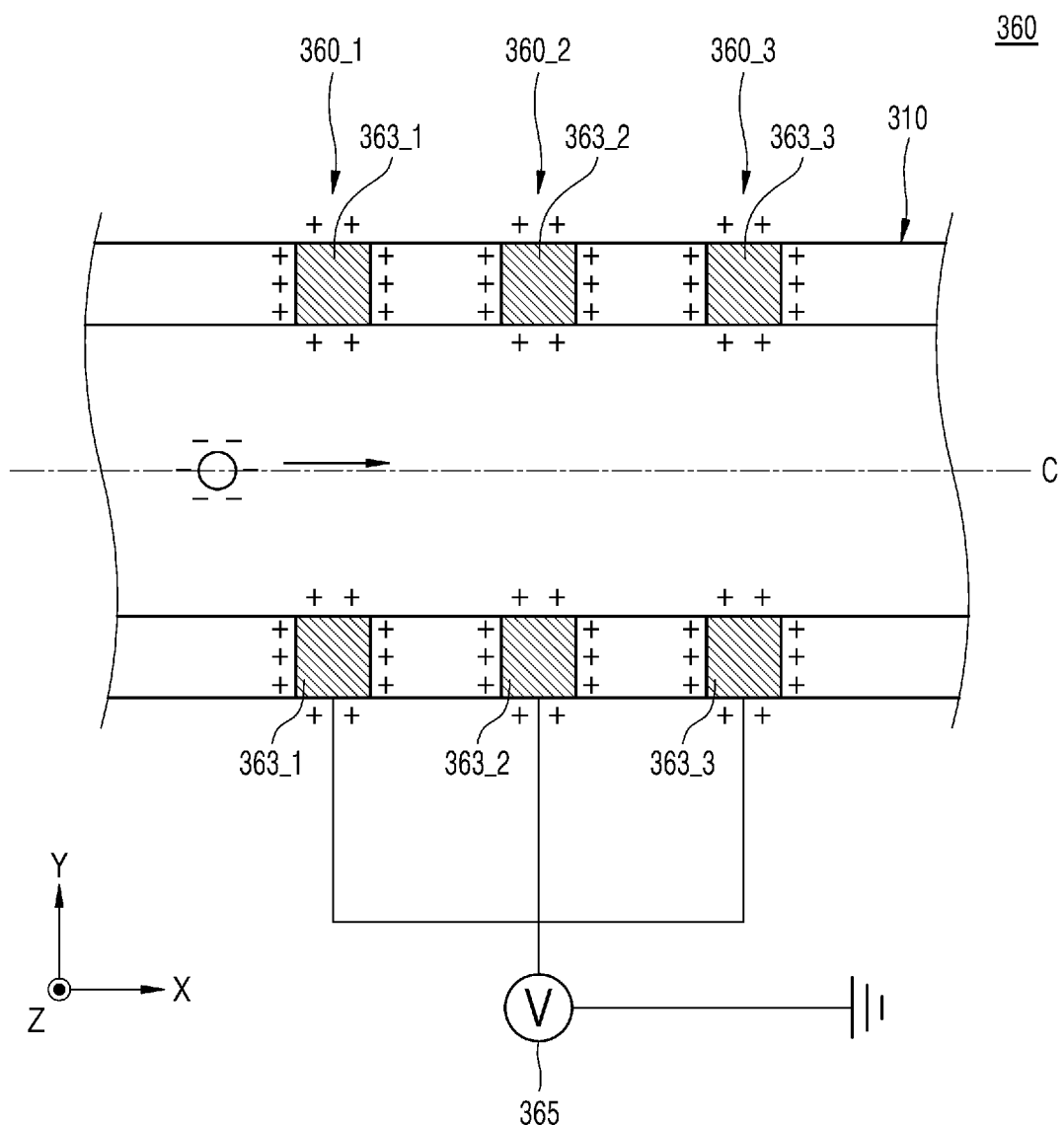
FIGS. 9 to 12 are diagrams illustrating a droplet accelerating apparatus according to an embodiment.

Referring to FIGS. 3 and 9, the droplet accelerating apparatus 360 of the droplet accelerating assembly 300 according to an embodiment may be an apparatus which is configured to accelerate an electrified droplet of the droplet accelerating chamber 310. In an embodiment, the droplet accelerating apparatus 360 may be an apparatus which is disposed in the droplet accelerating chamber 310 and is configured to accelerate an electrified droplet with an electric field by using the droplet electrifying apparatus 330.

In an embodiment, the droplet accelerating apparatus 360 may have a ring shape which extends along the inner surface of the droplet accelerating chamber 310 to surround a droplet ejected from the droplet generator 200. Also, the droplet accelerating apparatus 360 may be spaced apart from the droplet aligning apparatus 350 in the X direction.

In an embodiment, the droplet accelerating apparatus 360 may be provided in plurality. For example, the droplet accelerating apparatus 360 may include three droplet accelerating apparatuses (e.g., first to third droplet accelerating apparatuses) 360_1 to 360_3. However, the number of droplet accelerating apparatuses 360 is not limited thereto. For example, the first to third droplet accelerating apparatuses 360_1 to 360_3 may be spaced apart from one another in the X direction.

Also, the first to third droplet accelerating apparatuses 360_1 to 360_3 may respectively include first to third droplet accelerating electrodes 363_1 to 363_3, and may each include an acceleration power device 365, which is configured to apply a voltage to the first to third droplet accelerating electrodes 363_1 to 363_3.

In an embodiment, each of the first to third droplet accelerating electrodes 363_1 to 363_3 may be an electrode having a ring shape, which extends along the inner surface of the droplet accelerating chamber 310 to surround a droplet ejected from the droplet generator 200. In other words, the first to third droplet accelerating electrodes 363_1 to 363_3 may respectively be ring-shaped electrodes respectively including a plurality of acceleration holes 363H_1 to 363H_3, through which droplets pass, at center portions thereof.

In an embodiment, the first to third droplet accelerating electrodes 363_1 to 363_3 may include a conductive material. Therefore, a surface of each of the first to third droplet accelerating electrodes 363_1 to 363_3 may be electrified to a positive or negative polarity on the basis of voltage provided by the acceleration power device 365.

In an embodiment, the acceleration power device 365 may be a device configured to apply voltage to the first to third droplet accelerating electrodes 363_1 to 363_3. Also, the acceleration power device 365 may be outside the droplet accelerating chamber 310, and may be electrically connected to the first to third droplet accelerating electrodes 363_1 to 363_3 through a wiring including a conductive material. For example, the acceleration power device 365 may include at least one of a power supply and a high voltage power amplifier.

In an embodiment, the acceleration power device 365 may apply different voltages to the first to third droplet accelerating electrodes 363_1 to 363_3. In other words, the acceleration power device 365 may apply different voltages to the first to third droplet accelerating electrodes 363_1 to 363_3, and surfaces of the first to third droplet accelerating electrodes 363_1 to 363_3 may have different electrification intensities. However, embodiments are not limited thereto, e.g., the surfaces of the first to third droplet accelerating electrodes 363_1 to 363_3 may have substantially the same electrification intensity.

Hereinafter, a function of accelerating an electrified droplet by using the droplet accelerating apparatus 360 of the droplet accelerating assembly 300 will be described in more detail with reference to FIGS. 9 to 13.

Referring to FIG. 9, an electrified droplet, where a position thereof has been corrected by passing through the droplet aligning apparatus 350, may enter the first droplet accelerating electrode 363_1. For example, when a surface of an electrified droplet is electrified to a negative polarity, a surface of each of the first to third droplet accelerating electrodes 363_1 to 363_3 may be electrified to a positive polarity by the acceleration power device 365. Therefore, an electrified droplet, where a position thereof has been corrected by passing through the droplet aligning apparatus 350, may be accelerated in the X direction by an electrical attraction.

Figure 10:
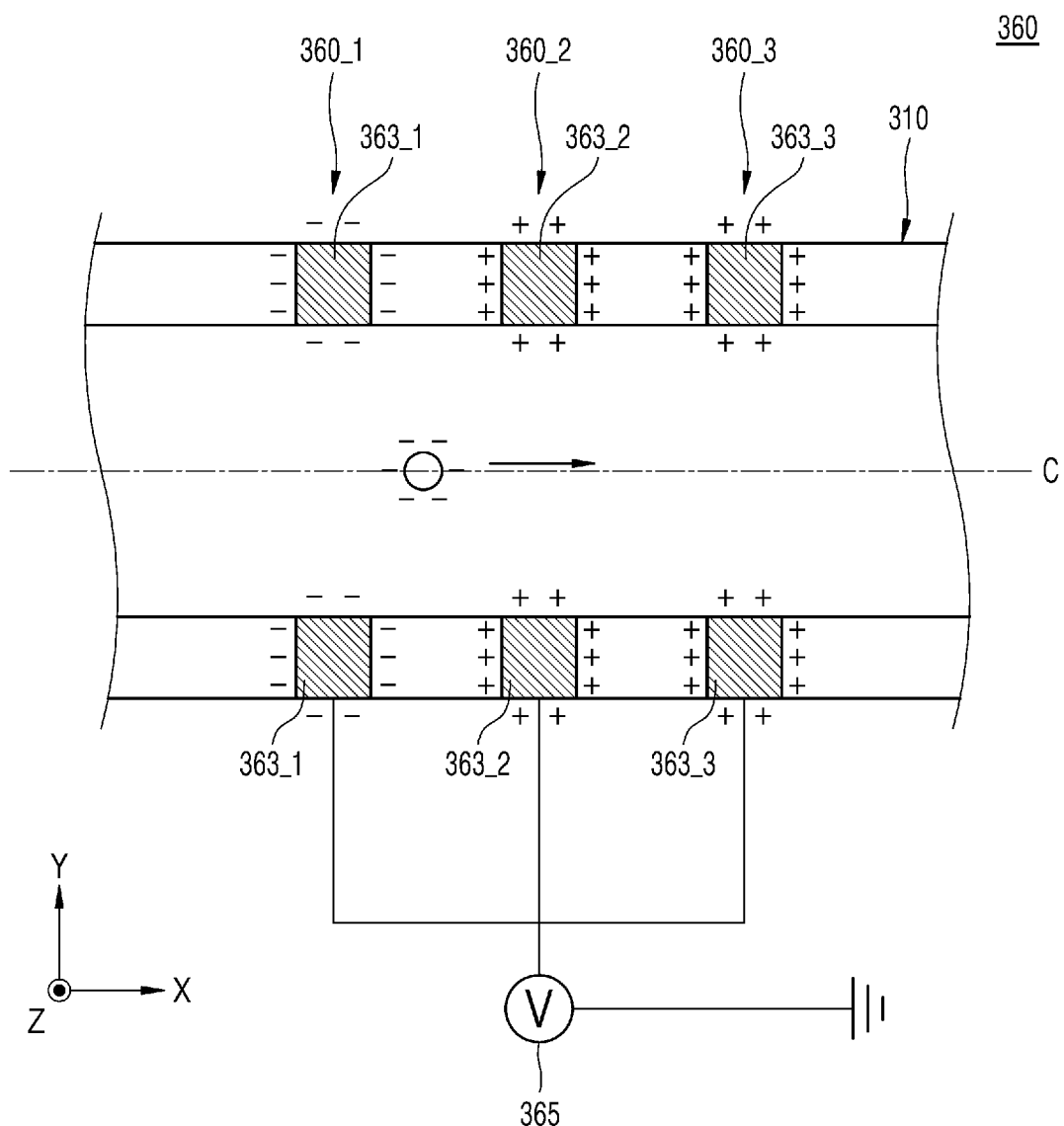

Also, referring to FIG. 10, when the electrified droplet passes the first droplet accelerating electrode 363_1 to be between the first droplet accelerating electrode 363_1 and the second droplet accelerating electrode 363_2, the polarity of the first droplet accelerating electrode 363_1 may change. For example, when a surface of the electrified droplet is electrified to a negative polarity, a surface of the first droplet accelerating electrode 363_1 may be electrified to a negative polarity by the acceleration power device 365. That is, a polarity of the surface of the first droplet accelerating electrode 363_1 may be changed to a negative polarity by the acceleration power device 365. Therefore, the electrified droplet may be accelerated in the X direction on the basis of a repulsion applied thereto through the first droplet accelerating electrode 363_1 and an attraction applied thereto through the second droplet accelerating electrode 363_2.

Figure 11:
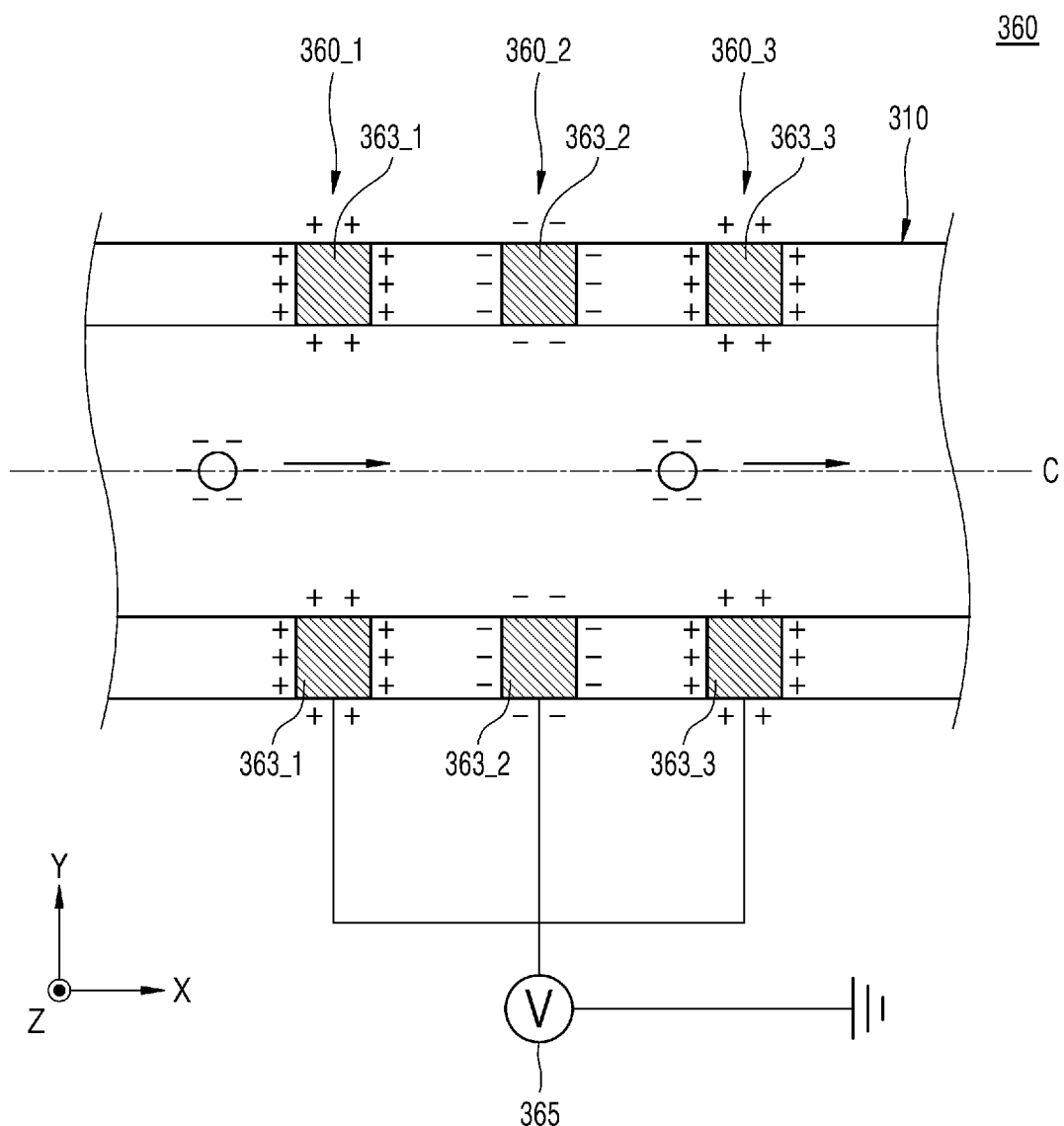

Also, referring to FIG. 11, the electrified droplet may be between the second droplet accelerating electrode 363_2 and the third droplet accelerating electrode 363_3. For example, when a surface of the electrified droplet is electrified to a negative polarity, a surface of the second droplet accelerating electrode 363_2 may be electrified to a positive polarity by the acceleration power device 365. That is, a polarity of the surface of the second droplet accelerating electrode 363_2 may be changed to a negative polarity by the acceleration power device 365. Therefore, the electrified droplet may be accelerated in the X direction on the basis of a repulsion applied thereto through the second droplet accelerating electrode 363_2 and an attraction applied thereto through the third droplet accelerating electrode 363_3.

Also, a subsequent electrified droplet may enter the first droplet accelerating electrode 363_1. For example, when a surface of a subsequent electrified droplet is electrified to a negative polarity, a surface of the first droplet accelerating electrode 363_1 may be electrified to a positive polarity by the acceleration power device 365. Therefore, a subsequent electrified droplet passing through the droplet aligning apparatus 350 may be accelerated in the X direction by an electrical attraction.

Figure 12:
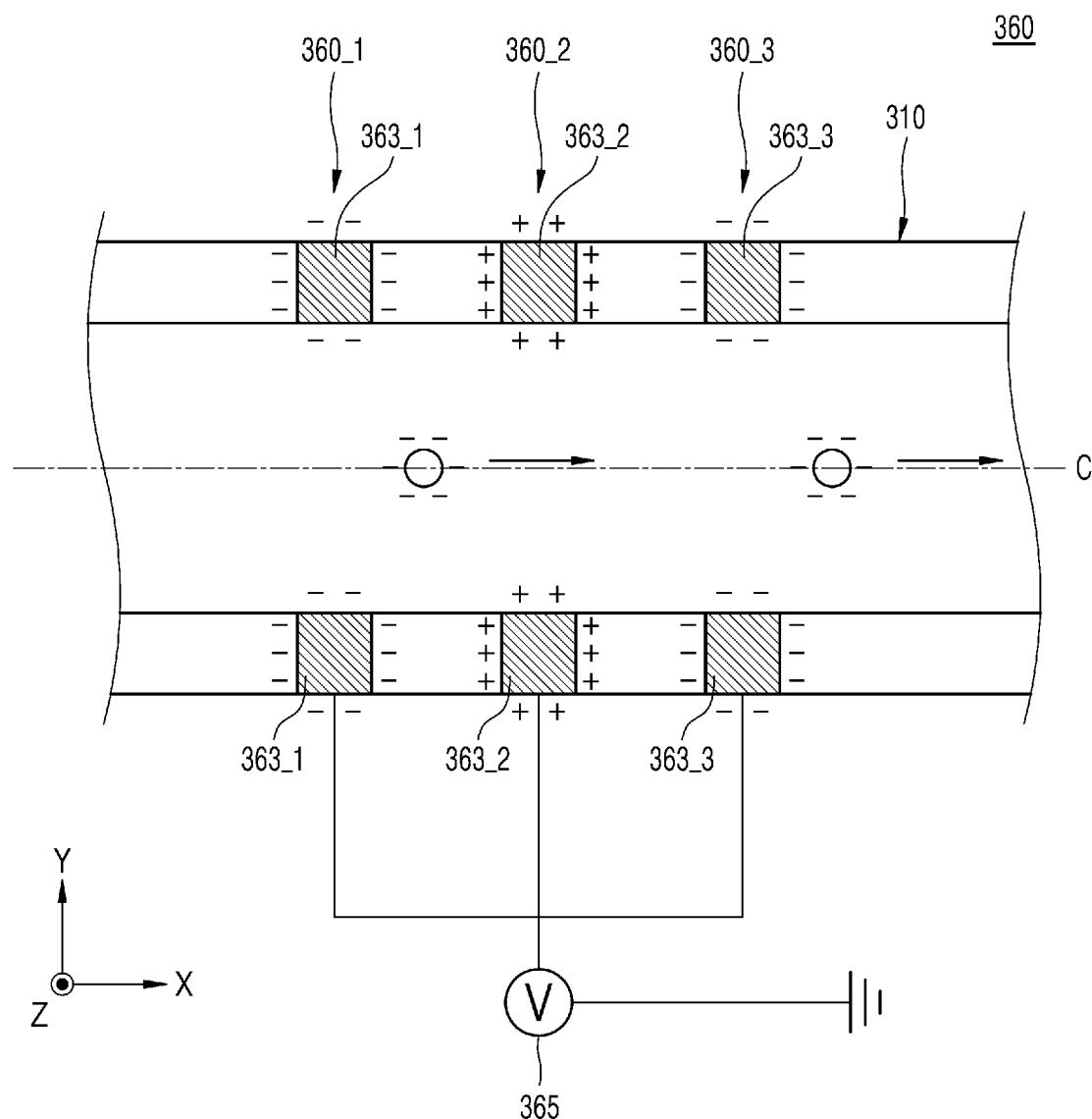

Also, referring to FIG. 12, when the electrified droplet passes through the third droplet accelerating electrode 363_3, a surface of the third droplet accelerating electrode 363_3 may be electrified to a negative polarity by the acceleration power device 365. Therefore, the electrified droplet may be accelerated in the X direction on the basis of a repulsion applied thereto through the third droplet accelerating electrode 363_3.

Also, the subsequent electrified droplet may be between the first droplet accelerating electrode 363_1 and the second droplet accelerating electrode 363_2. For example, when a surface of the subsequent electrified droplet is electrified to a negative polarity, a surface of the first droplet accelerating electrode 363_1 may be electrified to a negative polarity by the acceleration power device 365, and a surface of the second droplet accelerating electrode 363_2 may be electrified to a positive polarity by the acceleration power device 365. Therefore, the subsequent electrified droplet may be accelerated in the X direction on the basis of a repulsion applied thereto through the first droplet accelerating electrode 363_1 and an attraction applied thereto through the second droplet accelerating electrode 363_2.

Referring to FIGS. 3, 13, and 14, the first to third droplet accelerating electrodes 363_1 to 363_3 may respectively include first to third acceleration holes 363H_1 to 363H_3, through which electrified droplets pass, at center portions thereof. Also, lengths of the first to third acceleration holes 363H_1 to 363H_3 in the Y direction may be defined as widths 363d_1 to 363d_3 of the first to third acceleration holes 363H_1 to 363H_3. In other words, a length in a direction vertical, e.g., perpendicular, to a movement direction of an electrified droplet among the lengths of the first to third acceleration holes 363H_1 to 363H_3 may be defined as the widths 363d_1 to 363d_3 of the first to third acceleration holes 363H_1 to 363H_3.

In an embodiment, the widths 363d_1 to 363d_3 of the first to third acceleration holes 363H_1 to 363H_3 may be adjusted by a first driving apparatus 410. In other words, the first to third droplet accelerating electrodes 363_1 to 363_3 may adjust sizes of the first to third acceleration holes 363H_1 to 363H_3 through the first driving apparatus 410. For example, the first driving apparatus 410 may include a combination of a motor and a gear. However, a structure of the first driving apparatus 410 is not limited thereto.

Hereinafter, the first droplet accelerating electrode 363_1 will be described. A description of the first droplet accelerating electrode 363_1 may be identically applied to the second droplet accelerating electrode 363_2 and the third droplet accelerating electrode 363_3.

In an embodiment, the first droplet accelerating electrode 363_1 may have an aperture structure. In other words, the first droplet accelerating electrode 363_1 having the aperture structure may adjust the width 363d_1 of the first acceleration hole 363H_1 by using the first driving apparatus 410.

In an embodiment, the first droplet accelerating electrode 363_1 may include a plurality of shutter members 369_a to 369_f. The plurality of shutter members 369_a to 369_f may be provided in the same shape and may be disposed, e.g., arranged, to form different layers.

For example, the plurality of shutter members 369_a to 369_f may be disposed on different layers in a state where the plurality of shutter members 369_a to 369_f are spaced apart from one another by a certain interval. Therefore, when the plurality of shutter members 369_a to 369_f are performing a rotation operation, interference therebetween may not occur.

In an embodiment, the number of shutter members 369_a to 369_f may be six, and thus, a shape of the first acceleration hole 363H_1 of the first droplet accelerating electrode 363_1 may be hexagonal. However, the number of shutter members 369_a to 369_f and a shape of the first droplet accelerating electrode 363_1 based thereon are not limited thereto.

In an embodiment, the first acceleration hole 363H_1 may be formed at a portion where inner portions of the plurality of shutter members 369_a to 369_f meet each other. A size of the first acceleration hole 363H_1 may be adjusted based on a rotation operation of each of the plurality of shutter members 369_a to 369_f. In other words, the width 363d_1 of the first acceleration hole 363H_1 may be adjusted based on a rotation operation performed by the first driving apparatus 410 for the plurality of shutter members 369_a to 369_f.

In an embodiment, the first to third droplet accelerating electrodes 363_1 to 363_3 having the aperture structure may be applied to the droplet electrifying apparatus 330, the droplet monitoring apparatus 340, the droplet aligning apparatus 350, and the droplet accelerating apparatus 360.

In an embodiment, separation distances t1 and t2 between the first to third droplet accelerating electrodes 363_1 to 363_3 may be adjusted. In other words, the first to third droplet accelerating electrodes 363_1 to 363_3 may be spaced apart from one another in the X direction parallel to the ejection direction of a droplet, and the separation distances t1 and t2 between the first to third droplet accelerating electrodes 363_1 to 363_3 in the X direction may be adjusted by a second driving apparatus 420. For example, the second driving apparatus 420 may include a combination of a motor and a gear. However, a structure of the second driving apparatus 420 is not limited thereto.

In an embodiment, the first to third droplet accelerating electrodes 363_1 to 363_3 may be configured to move in the X direction through a slide mechanism, in the droplet accelerating chamber 310. However, a movement mechanism of each of the first to third droplet accelerating electrodes 363_1 to 363_3 is not limited thereto.

The sensor 370 of each of the first to third droplet accelerating electrodes 363_1 to 363_3 according to an embodiment may include a pressure sensor 373 and a distance sensor 375. In an embodiment, the pressure sensor 373 may be configured to measure internal pressure of the droplet accelerating chamber 310. Also, the pressure sensor 373 may be connected to the main controller 380 and may transfer a measured internal pressure value of the droplet accelerating chamber 310 to the main controller 380.

In an embodiment, the pressure controlling apparatus 320 may be configured to control a flow rate and a speed of air flowing into the droplet accelerating chamber 310 on the basis of a pressure value of the droplet accelerating chamber 310, measured by the pressure sensor 373. In other words, the main controller 380 may control the pressure controlling apparatus 320 to adjust the internal pressure of the droplet accelerating chamber 310, based on the pressure value of the droplet accelerating chamber 310, as measured by the pressure sensor 373.

In an embodiment, the distance sensor 375 may be configured to measure the widths 363d_1 to 363d_3 of the first to third acceleration holes 363H_1 to 363H_3 of the first to third droplet accelerating electrodes 363_1 to 363_3. For example, the distance sensor 375 may be in the droplet accelerating chamber 310, or may be outside the droplet accelerating chamber 310. Also, the distance sensor 375 may include at least one of an infrared distance sensor and an ultrasound distance sensor. However, the kind of the distance sensor 375 is not limited thereto, and the distance sensor 375 may include any suitable sensor. In an embodiment, the distance sensor 375 may transfer measurement values of the widths 363d_1 to 363d_3 of the first to third acceleration holes 363H_1 to 363H_3 to the main controller 380.

In an embodiment, the plurality of shutter members 369_a to 369_f of the first to third droplet accelerating electrodes 363_1 to 363_3 may be configured to rotate based on the measurement values of the widths 363d_1 to 363d_3 of the first to third acceleration holes 363H_1 to 363H_3, measured by the distance sensor 375. Therefore, the widths 363d_1 to 363d_3 of the first to third acceleration holes 363H_1 to 363H_3 may be controlled in real time.

The main controller 380 of the droplet accelerating assembly 300 according to an embodiment may be configured to overall control the droplet accelerating assembly 300. In an embodiment, the main controller 380 may be electrically connected to the pressure controlling apparatus 320, the droplet electrifying apparatus 330, the droplet monitoring apparatus 340, the droplet aligning apparatus 350, the droplet accelerating apparatus 360, and the sensor 370.

In an embodiment, the main controller 380 may control the electrification, alignment, and acceleration of a droplet in the droplet accelerating chamber 310. For example, the main controller 380 may electrify a droplet by using the droplet electrifying apparatus 330 described above, correct a position of the droplet by the droplet aligning apparatus 350 described above, and accelerate the droplet by using the droplet accelerating apparatus 360 described above.

In an embodiment, the main controller 380 may control in real time the movement of a droplet through feedback, based on a signal value obtained through measurement by the sensor 370. For example, the main controller 380 may be connected to the pressure sensor 373, which measures internal pressure of the droplet accelerating chamber 310, and may control the pressure controlling apparatus 320 in real time on the basis of the internal pressure of the droplet accelerating chamber 310, measured by the pressure sensor 373.

Also, the main controller 380 may be connected to the distance sensor 375, which measures lengths of the widths 363d_1 to 363d_3 of the first to third acceleration holes 363H_1 to 363H_3, and may control the first driving apparatus 410 on the basis of the widths 363d_1 to 363d_3 of the first to third acceleration holes 363H_1 to 363H_3, measured by the distance sensor 375. Also, the main controller 380 may control the widths 363d_1 to 363d_3 of the first to third acceleration holes 363H_1 to 363H_3 so as to control the electrification, alignment, and acceleration of a droplet in the droplet accelerating chamber 310.

In an embodiment, the main controller 380 may be implemented with hardware, firmware, software, or an arbitrary combination thereof. For example, the main controller 380 may include a computing device, e.g., a workstation computer, a desktop computer, a laptop computer, or a tablet computer. The main controller 380 may include a processor, e.g., a simple controller, a microprocessor, a central processing unit (CPU), or a graphics processing unit (GPU), a processor configured by software, dedicated hardware, or firmware.

In an embodiment, an operation of the main controller 380 may be implemented with instructions stored in a machine-readable medium readable and executable by one or more processors. Here, the machine-readable medium may include an arbitrary mechanism for storing and/or transmitting information in the form readable by a machine (for example, a computing device).

For example, the machine-readable medium may include read only memory (ROM), random access memory (RAM), a magnetic disk storage medium, an optical storage medium, flash memory devices, electrical, optical, acoustic, or other type of radio frequency signals (e.g., a carrier, an infrared signal, a digital signal, etc.), and other arbitrary signals.

The main controller 380 may be implemented with firmware, software, routine, and instructions for overall operating the droplet accelerating assembly 300. For example, the main controller 380 may be implemented with software, which receives data for feedback, generates a signal for operating the droplet accelerating assembly 300, and performs an arithmetic operation.

The EUV lithography apparatus 10 according to an embodiment may include the droplet accelerating assembly 300 which is disposed in the vessel 100 and is connected to the droplet generator 200 to adjust internal pressure thereof regardless of internal pressure of the vessel 100. Also, the droplet accelerating assembly 300 may include the droplet accelerating chamber 310, the pressure controlling apparatus 320, the droplet electrifying apparatus 330, the droplet monitoring apparatus 340, the droplet aligning apparatus 350, the droplet accelerating apparatus 360, and the sensor 370, and thus, may correct a position of a droplet ejected by the droplet generator 200. Therefore, the EUV lithography apparatus 10 including the droplet accelerating assembly 300 according to an embodiment may increase the efficiency of generating EUV light.

Figure 15:
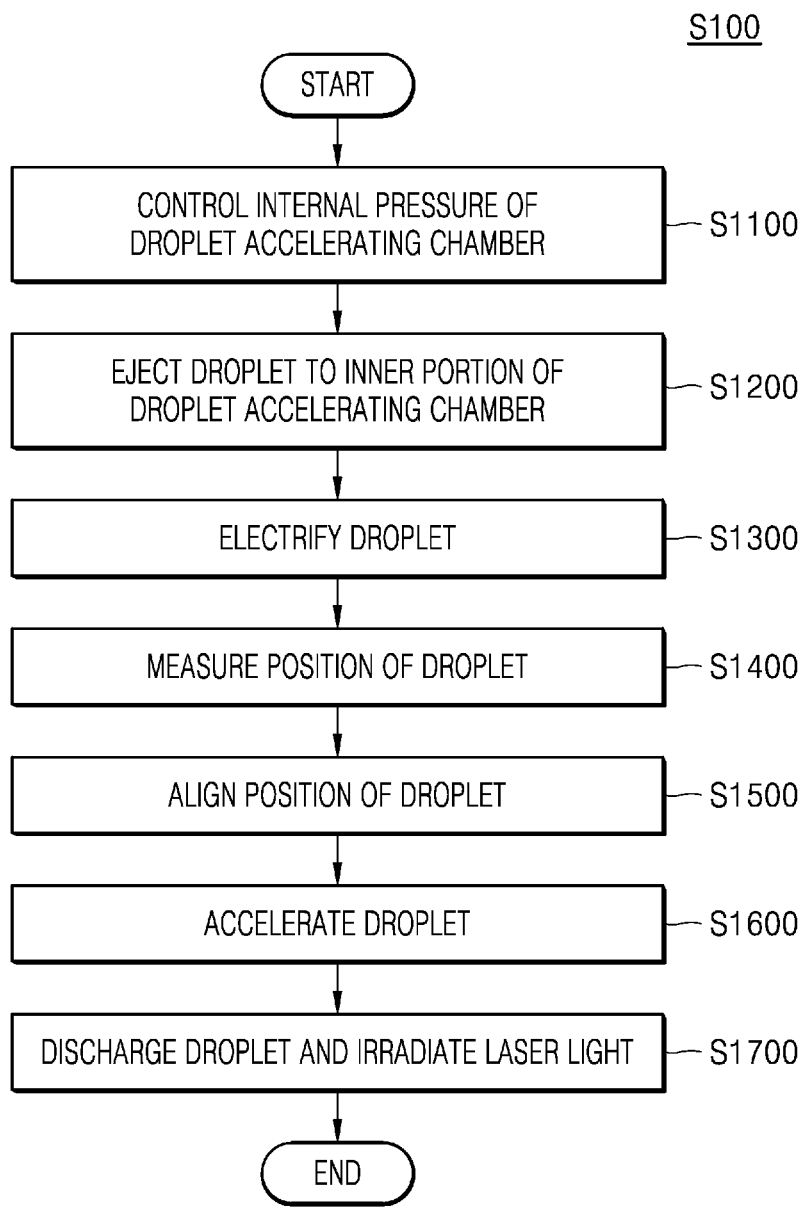
FIG. 15 is a flowchart of a method of generating EUV light by using an EUV lithography apparatus, according to an embodiment.

Hereinafter, a method of generating EUV light by using the EUV lithography apparatus 10 according to an embodiment will be described with reference to FIG. 15. FIG. 15 is a flowchart of a method S100 of generating EUV light by using the EUV lithography apparatus 10, according to an embodiment.

Referring to FIG. 15, the method S100 of generating EUV light by using the EUV lithography apparatus 10 according to an embodiment may include operation S1100 of controlling internal pressure of the droplet accelerating chamber 310, operation S1200 of ejecting a droplet to an inner portion of the droplet accelerating chamber 310 by using the droplet generator 200, operation S1300 of electrifying the droplet, operation S1400 of measuring a position of the droplet, operation S1500 of aligning the position of the droplet, operation S1600 of accelerating the droplet, and operation S1700 of irradiating laser light L onto the droplet discharged to the outside of the droplet accelerating chamber 310.

Operation S1100 may include an operation of adjusting the internal pressure of the droplet accelerating chamber 310 of the droplet accelerating assembly 300 by using the pressure controlling apparatus 320. In an embodiment, the internal pressure of the droplet accelerating chamber 310 may be controlled regardless of internal pressure of the vessel 100 where the droplet accelerating assembly 300 is disposed. For example, the internal pressure of the droplet accelerating chamber 310 of the droplet accelerating assembly 300 may be lower than the internal pressure of the vessel 100. However, the internal pressure of the droplet accelerating chamber 310 is not limited thereto and may have levels of various pressures.

Operation S1200 may include an operation of ejecting a droplet, which is a source material for generating EUV light, to the droplet accelerating chamber 310 of the droplet accelerating assembly 300 by using the droplet generator 200. In an embodiment, a source material for generating the EUV light may include Sn. However, the source material for generating the EUV light is not limited thereto.

Operation S1300 may include an operation of electrifying a surface of the droplet, ejected from the droplet generator 200, to a positive polarity or a negative polarity by using the droplet electrifying apparatus 330. In an embodiment, the droplet electrifying electrode 333 of the droplet electrifying apparatus 330 may be electrified to a positive polarity by the electrification power device 335. In this case, a surface of the droplet, which is ejected by the droplet generator 200 and passes through the droplet electrifying electrode 333, may be electrified to a negative polarity. However, embodiments are not limited thereto, and the droplet electrifying electrode 333 may be electrified to a negative polarity by the electrification power device 335. In this case, the surface of the droplet, which is ejected by the droplet generator 200 and passes through the droplet electrifying electrode 333, may be electrified to a positive polarity.

Operation S1400 may include an operation of measuring a position of an electrified droplet passing through the droplet electrifying apparatus 330 by using the droplet monitoring apparatus 340. In an embodiment, the droplet monitoring apparatus 340 may measure the position of the electrified droplet passing through the droplet electrifying apparatus 330 on the basis of an electric field generated by each of the first to fourth droplet monitoring electrodes 345_1 to 345_4. For example, while the electrified droplet is passing through the first to fourth droplet monitoring electrodes 345_1 to 345_4, the droplet monitoring apparatus 340 may sense a variation of an internal electric field of the droplet accelerating chamber 310 to measure the position of the electrified droplet.

Operation S1500 may include an operation of aligning the position of the electrified droplet passing through the droplet monitoring apparatus 340 by using the droplet aligning apparatus 350. In an embodiment, the droplet aligning apparatus 350 may align the position of the electrified droplet with an electromagnetic force by using a magnetic field M generated by each of the first to fourth electromagnets 355_1 to 355_4. For example, the droplet aligning apparatus 350 may asymmetrically apply a current to each of the first to fourth electromagnets 355_1 to 355_4 to correct the position of the electrified droplet, based on a position error of the electrified droplet measured by the droplet monitoring apparatus 340.

Operation S1600 may include an operation of accelerating the electrified droplet passing through the droplet aligning apparatus 350 by using the droplet accelerating apparatus 360. In an embodiment, each of the first to third droplet accelerating electrodes 363_1 to 363_3 of the droplet accelerating apparatus 360 may be electrified to a positive or negative polarity through the acceleration power device 365.

For example, the first to third droplet accelerating electrodes 363_1 to 363_3 of the droplet accelerating apparatus 360 may be electrified, and thus, the electrified droplet passing through the droplet aligning apparatus 350 may be accelerated by an attraction and a repulsion generated by the first to third droplet accelerating electrodes 363_1 to 363_3. In an embodiment, the first to third droplet accelerating electrodes 363_1 to 363_3 may have the aperture structure, and thus, the widths 363d_1 to 363d_3 of the first to third acceleration holes 363H_1 to 363H_3 of the first to third droplet accelerating electrodes 363_1 to 363_3 may be adjusted.

For example, the widths 363d_1 to 363d_3 of the first to third acceleration holes 363H_1 to 363H_3 of the first to third droplet accelerating electrodes 363_1 to 363_3 may be measured by the distance sensor 375. Also, the widths 363d_1 to 363d_3 of the first to third acceleration holes 363H_1 to 363H_3 of the first to third droplet accelerating electrodes 363_1 to 363_3 may be controlled in real time on the basis of a measurement value of the distance sensor 375.

Also, the first to third droplet accelerating electrodes 363_1 to 363_3 of the droplet accelerating apparatus 360 may be spaced apart from one another in the X direction, and the separation distances t1 and t2 between the first to third droplet accelerating electrodes 363_1 to 363_3 in the X direction may be controlled in real time.

Operation S1700 may include an operation of discharging the electrified droplet to the outside of the droplet accelerating chamber 310 and irradiating laser light L, emitted from the light source 400, onto the electrified droplet. In operation S1700, EUV light may be generated from a droplet having a plasma state. For example, the laser light L emitted from the light source 400 may include carbon dioxide laser light. In an embodiment, the EUV light generated from the droplet having a plasma state may be reflected by the reflection module 500 and may concentrate on one point of an inner portion of the vessel 100.

The droplet accelerating assembly 300 of the EUV lithography apparatus 10 according to an embodiment may include the droplet accelerating apparatus 360, and thus, the droplet accelerating assembly 300 may accelerate a droplet in the droplet accelerating chamber 310. In other words, the droplet acceleration assembly 300 may increase a separation distance between droplets in the droplet accelerating chamber 310.

Therefore, the EUV lithography apparatus 10 may minimize interference which occurs due to plasma in a process of generating the EUV light. That is, the EUV lithography apparatus 10 may increase the efficiency of generating EUV light. Also, the droplet accelerating assembly 300 of the EUV lithography apparatus 10 according to an embodiment may include the droplet monitoring apparatus 340 and the droplet aligning apparatus 350, thereby enhancing the accuracy of correcting a position of an electrified droplet and the accuracy of transferring the electrified droplet.

By way of summation and review, embodiments provide a droplet accelerating assembly and an EUV lithography apparatus including the same, which increase the efficiency of generating EUV light. That is, according to embodiments, a droplet accelerating assembly may include a droplet accelerating chamber, a pressure controlling apparatus, a droplet electrifying apparatus, a droplet monitoring apparatus, a droplet aligning apparatus, a droplet accelerating apparatus, and a sensor, and thus, may accelerate a droplet while correcting a position of the droplet ejected by a droplet generator. Therefore, the EUV lithography apparatus including the droplet accelerating assembly according to an embodiment may increase the efficiency of generating EUV light.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A droplet accelerating assembly configured to accelerate a droplet ejected by a droplet generator, the droplet accelerating assembly comprising:
    an acceleration chamber extending in a first direction parallel to an ejection direction of the droplet, the acceleration chamber including:
        a first side connected to the droplet generator,
        a second side opposite the first side in the first direction, the second side including a discharge hole, and
        a fluid flow path;
    a pressure controller connected to the fluid flow path of the acceleration chamber, the pressure controller being configured to adjust an internal pressure of the acceleration chamber;
    an electrifier in the acceleration chamber, the electrifier being configured to electrify the droplet ejected by the droplet generator into an electrified droplet; and
    an accelerator in the acceleration chamber, the accelerator being configured to accelerate the electrified droplet and including an accelerating electrode having a ring shape extending along an inner surface of the acceleration chamber, the accelerating electrode including an acceleration hole through a center portion thereof, and a width of the acceleration hole being adjustable.

2. The droplet accelerating assembly as claimed in claim 1, wherein the electrifier includes:
    an electrifying electrode having a ring shape, the electrifying electrode extending along an inner surface of the acceleration chamber to surround the droplet ejected by the droplet generator; and
    an electrification power device configured to apply a voltage to the electrifying electrode.

3. The droplet accelerating assembly as claimed in claim 1, further comprising a monitor in the acceleration chamber and adjacent to the electrifier, the monitor including monitoring electrodes spaced apart from each other along an inner surface of the acceleration chamber, and the monitor being configured to sense an electric field variation of an inner portion of the acceleration chamber to measure a position of the electrified droplet after passing through the electrifier.

4. The droplet accelerating assembly as claimed in claim 3, further comprising an aligner in the acceleration chamber, the aligner including electromagnets spaced apart from each other along the inner surface of the acceleration chamber, the aligner being configured to correct a position of the electrified droplet after passing through the monitor.

5. The droplet accelerating assembly as claimed in claim 1, wherein the accelerator further includes:
    an acceleration power device configured to apply a voltage to the accelerating electrode.

6. The droplet accelerating assembly as claimed in claim 5, wherein the accelerating electrode of the accelerator includes sub-accelerating electrodes spaced apart from one another in the first direction, a separation distance between the sub-accelerating electrodes being adjustable.

7. The droplet accelerating assembly as claimed in claim 1, wherein the accelerating electrode further includes shutter portions arranged in different layers, inner edges of the shutter portions contact each other to define the acceleration hole,
  wherein an interference between the shutter portions does not occur while a rotation operation of each of the shutter portions is being performed, and
  wherein the width of the acceleration hole is adjustable based on the rotation operation of each of the shutter portions.

8. A droplet accelerating assembly configured to accelerate a droplet ejected by a droplet generator, the droplet accelerating assembly comprising:
  an acceleration chamber extending in a first direction parallel to an ejection direction of the droplet, the acceleration chamber including:
    a first side connected to the droplet generator,
    a second side opposite the first side in the first direction, the second side including a discharge hole, and
    a fluid flow path;
  a pressure controller connected to the fluid flow path of the acceleration chamber, the pressure controller being configured to adjust an internal pressure of the acceleration chamber;
  an electrifier in the acceleration chamber, the electrifier being configured to electrify the droplet ejected by the droplet generator into an electrified droplet, and the electrifier including:
    an electrifying electrode having a ring shape along an inner surface of the acceleration chamber, and
    an electrification power device configured to apply a voltage to the electrifying electrode;
  an accelerator in the acceleration chamber, the accelerator being configured to accelerate the electrified droplet, and the accelerator including:
    an accelerating electrode having a ring shape along the inner surface of the acceleration chamber, the accelerating electrode including an acceleration hole through a center thereof, and a width of the acceleration hole being adjustable, and
    an acceleration power device configured to apply a voltage to the accelerating electrode; and
  a main controller connected to the pressure controller, to the electrifier, and to the accelerator, the main controller being configured to control the internal pressure of the acceleration chamber, a degree of electrification of the electrifying electrode, and a degree of electrification of the accelerating electrode.

9. The droplet accelerating assembly as claimed in claim 8, further comprising a pressure sensor connected to the main controller, the pressure sensor being configured to measure the internal pressure of the acceleration chamber, and the main controller being configured to control the pressure controller based on the internal pressure of the acceleration chamber measured by the pressure sensor.

10. The droplet accelerating assembly as claimed in claim 8, wherein the accelerating electrode of the accelerator further includes shutter portions arranged in different layers, inner edges of the shutter portions that contact each other defining the acceleration hole through the center of the accelerating electrode,
  wherein an interference between the shutter portions does not occur while a rotation operation of each of the shutter portions is being performed, and
  wherein the width of the acceleration hole is adjustable based on the rotation operation of each of the shutter portions.

11. The droplet accelerating assembly as claimed in claim 10, further comprising a distance sensor configured to measure the width of the acceleration hole, the shutter portions being configured to rotate based on the width of the acceleration hole measured by the distance sensor.

12. The droplet accelerating assembly as claimed in claim 8, wherein the fluid flow path of the acceleration chamber includes:
  at least one inflow path in fluid communication with an inner portion of the acceleration chamber and an exterior of the acceleration chamber; and
  at least one discharge flow path in fluid communication with the inner portion of the acceleration chamber and the exterior of the acceleration chamber, at least one of the at least one inflow path and the at least one discharge flow path being connected to the pressure controller.

13. The droplet accelerating assembly as claimed in claim 12, wherein the at least one inflow path and the at least one discharge flow path cross a center of the acceleration chamber, the at least one inflow path and the at least one discharge flow path being symmetrical with respect to an axis extending in the first direction through the acceleration chamber.

14. The droplet accelerating assembly as claimed in claim 8, further comprising:
  a monitor including monitoring electrodes on the inner surface of the acceleration chamber, the monitor being configured to sense an electric field variation of an inner portion of the acceleration chamber to measure a position of the electrified droplet after passing through the electrifier; and
  an aligner on the inner surface of the acceleration chamber, the aligner including electromagnets configured to correct the position of the electrified droplet after passing through the monitor.

15. An extreme ultra-violet (EUV) lithography apparatus, comprising:
  a vessel;
  a droplet generator in the vessel, the droplet generator being configured to generate and eject a droplet;
  a droplet accelerating assembly in the vessel, the droplet accelerating assembly including:
    an acceleration chamber extending in a first direction parallel to an ejection direction of the droplet, the acceleration chamber having:
      a first side connected to the droplet generator,
      a second side opposite the first side in the first direction, the second side including a discharge hole to discharge the droplet, and
      a fluid flow path,
    a pressure controller connected to the fluid flow path of the acceleration chamber, the pressure controller being configured to adjust an internal pressure of the acceleration chamber,
    an electrifier in the acceleration chamber, the electrifier being configured to electrify the droplet ejected by the droplet generator into an electrified droplet, and
    an accelerator in the acceleration chamber, the accelerator being configured to accelerate the electrified droplet and including an accelerating electrode having a ring shape extending along an inner surface of the acceleration chamber, the accelerating electrode including an acceleration hole through a center thereof, and a width of the acceleration hole being adjustable;

a light source in the vessel, the light source being configured to irradiate laser light onto the droplet discharged from the droplet accelerating assembly; and a reflector coupled to the vessel, the reflector being configured to collect EUV light generated in the vessel.

16. The EUV lithography apparatus as claimed in claim 15, wherein the light source is configured to emit carbon dioxide laser light.

17. The EUV lithography apparatus as claimed in claim 15, wherein the acceleration chamber includes an insulating material.

18. The EUV lithography apparatus as claimed in claim 15, wherein the accelerator further includes:

shutter portions in the accelerating electrode that are arranged in different layers, inner edges of the shutter portions that contact each other defining the acceleration hole through the center of the accelerating electrode; and an acceleration power device configured to apply a voltage to the accelerating electrode, wherein an interference between the shutter portions does not occur while a rotation operation of each of the shutter portions is being performed, and wherein the width of the acceleration hole is adjustable based on the rotation operation of each of the shutter portions.

19. The EUV lithography apparatus as claimed in claim 18, further comprising:

a pressure sensor configured to measure the internal pressure of the acceleration chamber; and a distance sensor configured to measure the width of the acceleration hole of the accelerating electrode.

\* \* \* \* \*